United States Patent
Shimamoto et al.

(10) Patent No.: US 7,259,058 B2
(45) Date of Patent: Aug. 21, 2007

(54) FABRICATING METHOD OF SEMICONDUCTOR INTEGRATED CIRCUITS

(75) Inventors: Yasuhiro Shimamoto, Hachioji (JP); Masahiko Hiratani, Akishima (JP); Yuichi Matsui, Kokubunji (JP); Satoshi Yamamoto, Ome (JP); Toshihide Nabatame, Tsukuba (JP); Toshio Ando, Kunitachi (JP); Hiroshi Sakuma, Ome (JP); Shinpei Iijima, Akishima (JP)

(73) Assignee: Renesas Techonology Corp., Tokyo (JP)

( * ) Notice: Subject to any disclaimer, the term of this patent is extended or adjusted under 35 U.S.C. 154(b) by 0 days.

(21) Appl. No.: 10/020,314

(22) Filed: Dec. 18, 2001

(65) Prior Publication Data

US 2002/0102826 A1    Aug. 1, 2002

(30) Foreign Application Priority Data

Jan. 31, 2001    (JP)    ............................. 2001-024389

(51) Int. Cl.
*H01L 21/8242* (2006.01)
(52) U.S. Cl. .................. 438/240; 438/686; 257/E21.17
(58) Field of Classification Search ................ 438/686, 438/758, 778, 781, 239, 240, 396, 575, 580; 257/296, 301, 302, 303, 304, 305, 306, E21.009, 257/E21.011, E21.17, E27.088
See application file for complete search history.

(56) References Cited

U.S. PATENT DOCUMENTS

| | | | |
|---|---|---|---|
| 5,352,623 A | | 10/1994 | Kamiyama |
| 6,281,125 B1 * | | 8/2001 | Vaartstra et al. ............. 438/681 |
| 6,287,934 B1 * | | 9/2001 | Ochiai ......................... 438/396 |
| 6,297,122 B1 * | | 10/2001 | Eguchi et al. .............. 438/396 |
| 6,316,064 B1 * | | 11/2001 | Onozawa et al. ........... 427/585 |
| 6,440,495 B1 * | | 8/2002 | Wade et al. ................. 427/250 |
| 6,461,909 B1 * | | 10/2002 | Marsh et al. ............... 438/238 |
| 6,544,834 B1 * | | 4/2003 | Sugawara et al. .......... 438/240 |

(Continued)

FOREIGN PATENT DOCUMENTS

JP    6-244364    2/1993

OTHER PUBLICATIONS

Masahiko Hiratani, Toshihide Nabatame, Yuichi Matsui,, Yasuhiro Shimamoto, Yoshitaka Sasago, Yoshitaka Nakamura, Yuzuru Ohji, Isamu Asano and Shinichiro Kimura, "A Conformal Ruthenium electrode for MIM Capacitors in Gbit DRAMs Using the CVD Technology Based on Oxygen-Controlled Surface Reaction", 2000 Symposium on VLSI Technology Digest of Technical Papers, pp. 102-103.

*Primary Examiner*—Matthew Smith
*Assistant Examiner*—Khiem D Nguyen
(74) *Attorney, Agent, or Firm*—Reed Smith LLP; Stanley P. Fisher, Esq.; Juan Carlos A. Marquez, Esq.

(57) ABSTRACT

A ruthenium electrode with a low amount of oxygen contamination and high thermal stability is formed by a chemical vapor deposition method. In the chemical vapor deposition method using an organoruthenium compound as a precursor, the introduction of an oxidation gas is limited to when the precursor is supplying, and the reaction is allowed to occur at a low oxygen partial pressure. Consequently, it is possible to form a ruthenium film with a low amount of oxygen contamination. Further, after formation of the ruthenium film, annealing at not less than the formation temperature is performed, thereby forming a ruthenium film with high thermal stability.

29 Claims, 16 Drawing Sheets

U.S. PATENT DOCUMENTS

| | | |
|---|---|---|
| 6,617,248 B1 * | 9/2003 | Yang .......................... 438/686 |
| 6,743,739 B2 * | 6/2004 | Shimamoto et al. ........ 438/780 |
| 6,992,022 B2 * | 1/2006 | Shimamoto et al. ........ 438/780 |
| 2001/0006838 A1 * | 7/2001 | Won et al. .................. 438/396 |
| 2001/0031527 A1 * | 10/2001 | Park .......................... 438/239 |
| 2002/0058414 A1 * | 5/2002 | Derderian et al. |
| 2003/0215994 A1 * | 11/2003 | Choi et al. .................. 438/240 |

* cited by examiner

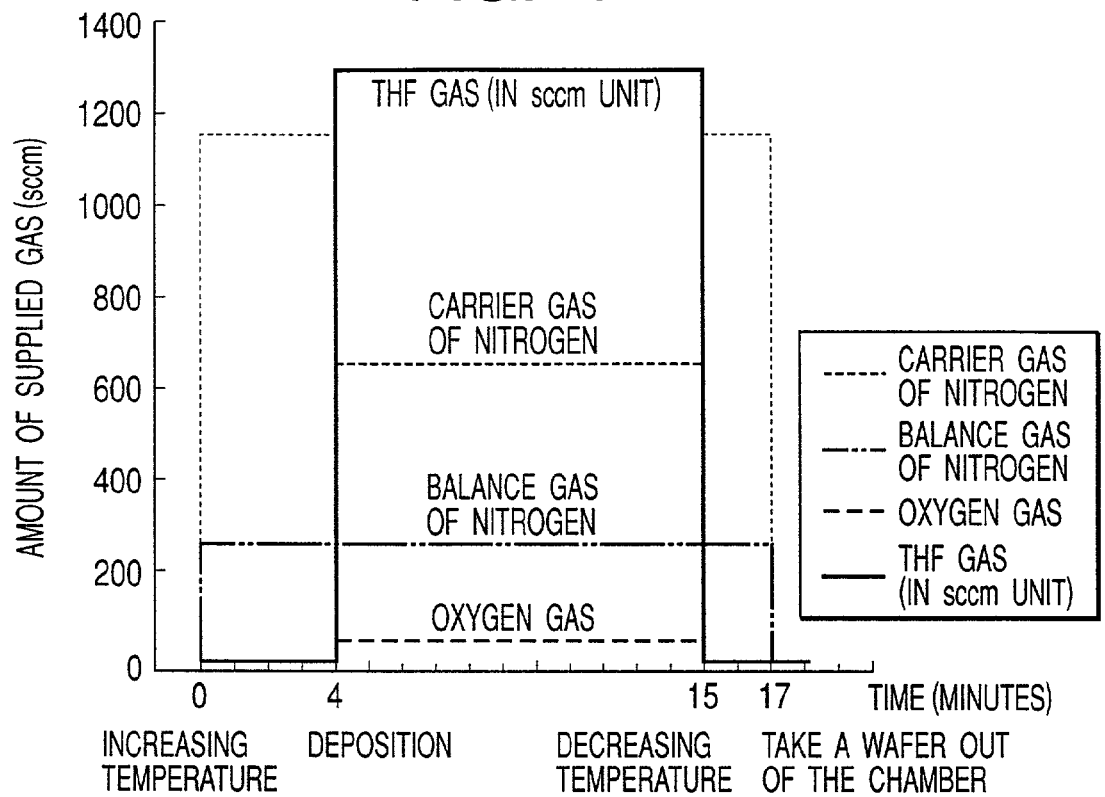
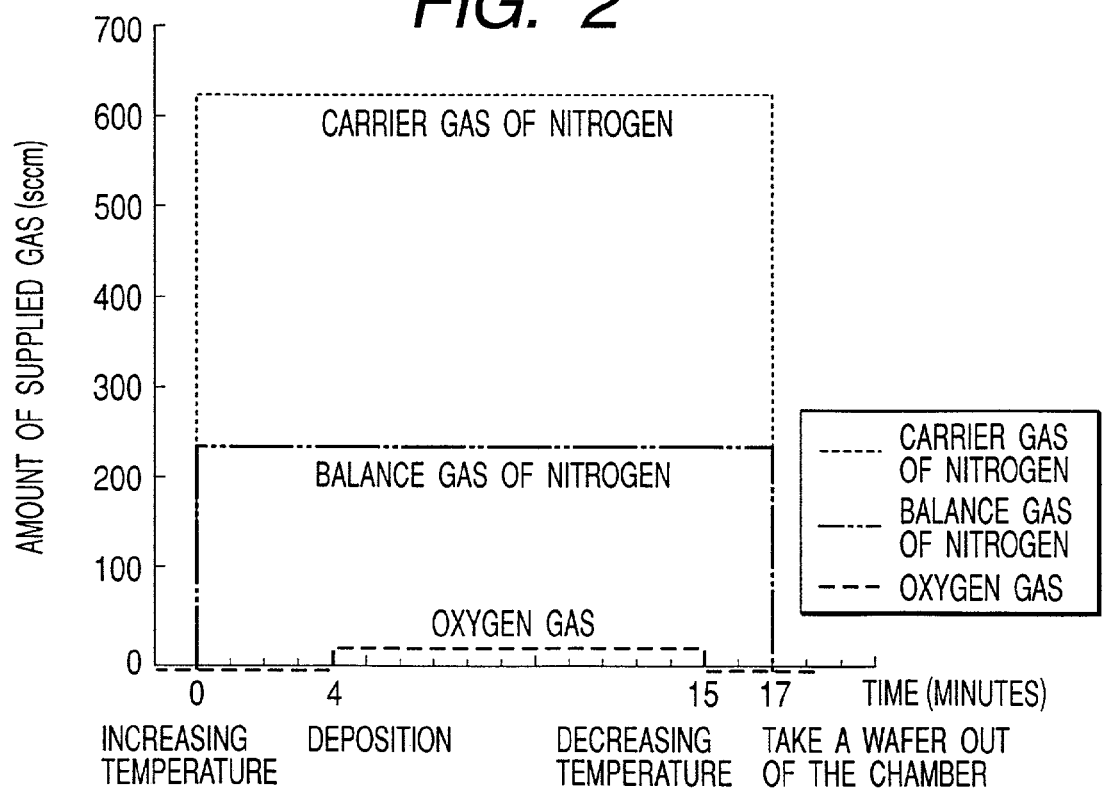

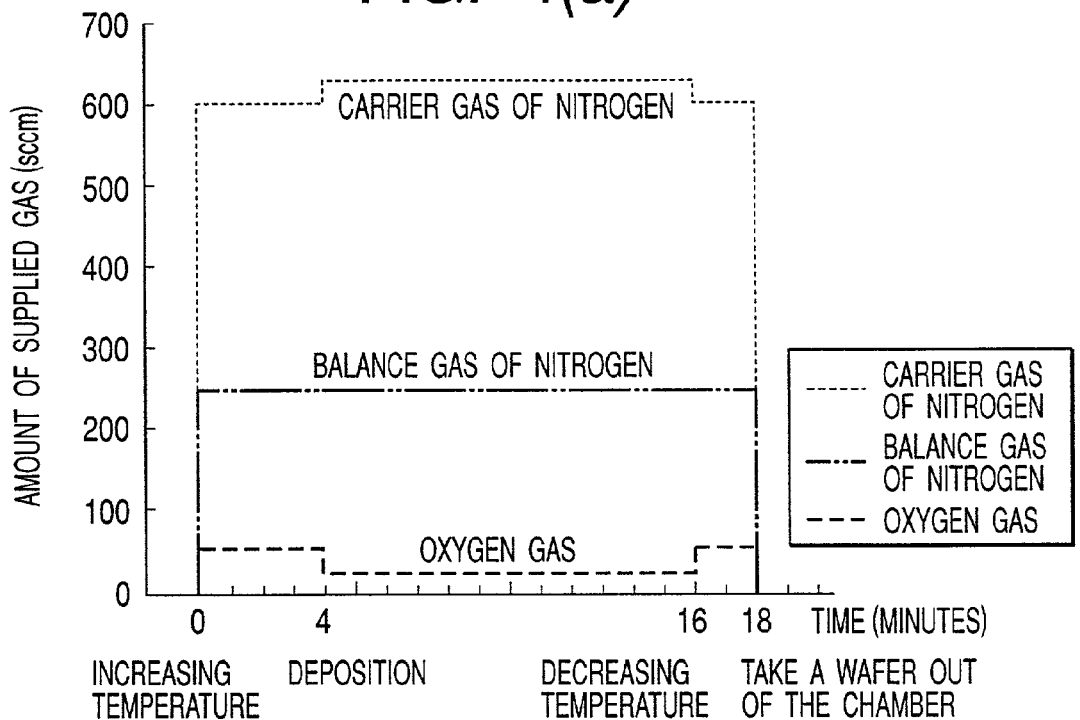
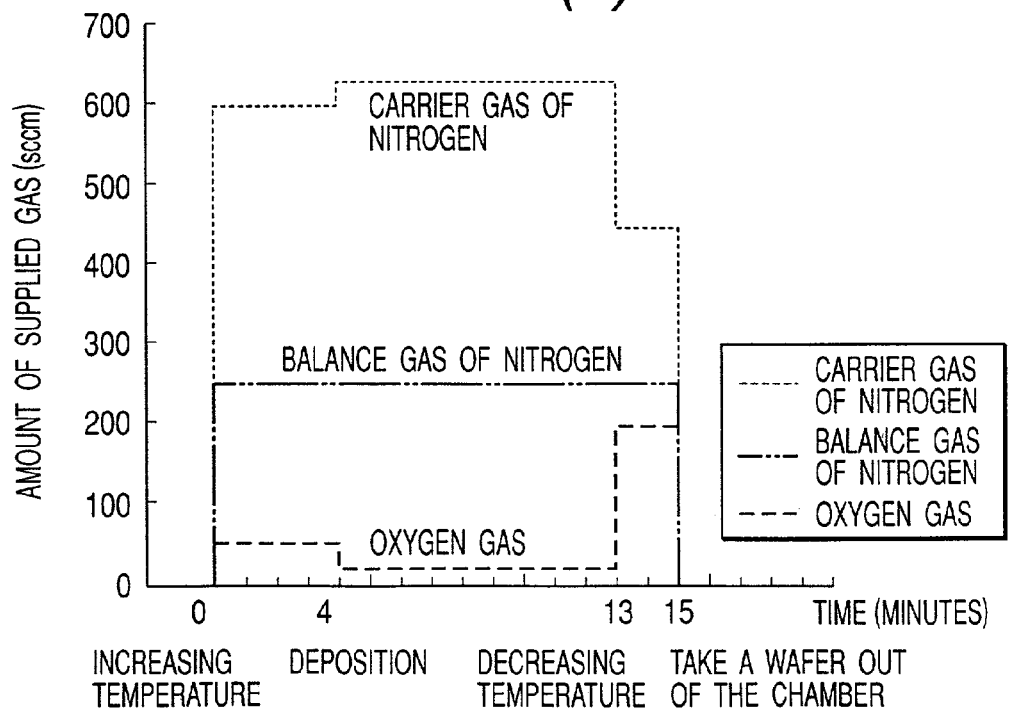

FIG. 5(a)

| RECIPE NO. | PRECURSOR OF CHEMICAL VAPOR DEPOSITION | RUTHENIUM SEED LAYER | EXPERIMENTAL CONDITIONS | CVD GROWTH TEMPERATURE (°C) | STEP 1: INCREASING THE WAFER TEMPERATURE | STEP 2: SUPPLYING THE PRECURSOR | STEP 3: DECREASING THE WAFER TEMPERATURE | AMOUNT OF OXYGEN CONTAMINATION atom/$cm^2$ |
|---|---|---|---|---|---|---|---|---|
| 1 | Ru($C_5H_4C_2H_5$)$_2$ | NON LAYER | $N_2$ CARRIER GAS(sccm)<br>OXYGEN GAS(sccm)<br>$N_2$ BALANCE GAS(sccm)<br>TOTAL AMOUNT OF SUPPLIED GASES(sccm)<br>PRESSURE(Torr) | 220—270 | 650<br>20<br>250<br>920<br>5 | 650<br>20<br>250<br>920<br>5 | 650<br>20<br>250<br>920<br>5 | 7.0E+15 |
| 2 | Ru($C_5H_4C_2H_5$)$_2$ | NON LAYER | $N_2$ CARRIER GAS(sccm)<br>OXYGEN GAS(sccm)<br>$N_2$ BALANCE GAS(sccm)<br>TOTAL AMOUNT OF SUPPLIED GASES(sccm)<br>PRESSURE(Torr) | 220—270 | 650<br>20<br>250<br>920<br>5 | 650<br>20<br>250<br>920<br>5 | 650<br>20<br>250<br>900<br>5 | 5.0E+14 |
| 3 | Ru($C_5H_4C_2H_5$)$_2$ | NON LAYER | $N_2$ CARRIER GAS(sccm)<br>OXYGEN GAS(sccm)<br>$N_2$ BALANCE GAS(sccm)<br>TOTAL AMOUNT OF SUPPLIED GASES(sccm)<br>PRESSURE(Torr) | 220—270 | 650<br>0<br>250<br>900<br>5 | 650<br>20<br>250<br>920<br>5 | 650<br>20<br>250<br>920<br>5 | 7.0E+15 |
| 4 | Ru($C_5H_4C_2H_5$)$_2$ | NON LAYER | $N_2$ CARRIER GAS(sccm)<br>OXYGEN GAS(sccm)<br>$N_2$ BALANCE GAS(sccm)<br>TOTAL AMOUNT OF SUPPLIED GASES(sccm)<br>PRESSURE(Torr) | 220—270 | 650<br>0<br>250<br>900<br>5 | 650<br>20<br>250<br>920<br>5 | 650<br>0<br>250<br>900<br>5 | <1E14 |
| 5 | Ru($C_5H_4C_2H_5$)$_2$ | NON LAYER | $N_2$ CARRIER GAS(sccm)<br>OXYGEN GAS(sccm)<br>$N_2$ BALANCE GAS(sccm)<br>TOTAL AMOUNT OF SUPPLIED GASES(sccm)<br>PRESSURE(Torr) | 220—270 | 650<br>0<br>250<br>900<br>5 | 650<br>500<br>250<br>1400<br>5 | 650<br>0<br>250<br>900<br>5 | 1.0E+17 |

FIG. 5(b)

| RECIPE NO. | PRECURSOR OF CHEMICAL VAPOR DEPOSITION | RUTHENIUM SEED LAYER | EXPERIMENTAL CONDITIONS | CVD GROWTH TEMPERATURE (°C) | STEP 1: INCREASING THE WAFER TEMPERATURE | STEP 2: SUPPLYING THE PRECURSOR | STEP 3: DECREASING THE WAFER TEMPERATURE | AMOUNT OF OXYGEN CONTAMINATION atom/cm² |
|---|---|---|---|---|---|---|---|---|
| 6 | Ru(C5H4C2H5)2 | 1nm~2nm | N2 CARRIER GAS(sccm)<br>OXYGEN GAS(sccm)<br>N2 BALANCE GAS(sccm)<br>TOTAL AMOUNT OF SUPPLIED GASES(sccm)<br>PRESSURE(Torr) | 220-270 | 650<br>20<br>250<br>920<br>5 | 650<br>20<br>250<br>920<br>5 | 650<br>0<br>250<br>900<br>5 | 2.0E+15 |
| 7 | Ru(C5H4C2H5)2 | 1nm~2nm | N2 CARRIER GAS(sccm)<br>OXYGEN GAS(sccm)<br>N2 BALANCE GAS(sccm)<br>TOTAL AMOUNT OF SUPPLIED GASES(sccm)<br>PRESSURE(Torr) | 220-270 | 650<br>20<br>250<br>920<br>5 | 650<br>20<br>250<br>920<br>5 | 650<br>20<br>250<br>920<br>5 | 7.0E+15 |
| 8 | Ru(C5H4C2H5)2 | 1nm~2nm | N2 CARRIER GAS(sccm)<br>OXYGEN GAS(sccm)<br>N2 BALANCE GAS(sccm)<br>TOTAL AMOUNT OF SUPPLIED GASES(sccm)<br>PRESSURE(Torr) | 220-270 | 650<br>20<br>250<br>900<br>5 | 650<br>20<br>250<br>920<br>5 | 650<br>0<br>250<br>900<br>5 | <1E14 |
| 9 | Ru(C5H4C2H5)2/THF 0.1mol/1 | NON LAYER | N2 CARRIER GAS(sccm)<br>OXYGEN GAS(sccm)<br>THF GAS(sccm)<br>N2 BALANCE GAS(sccm)<br>TOTAL AMOUNT OF SUPPLIED GASES(sccm)<br>PRESSURE(Torr) | 270-350 | 1150<br>0<br>250<br>1400<br>5 | 650<br>50<br>1300<br>250<br>2250<br>5 | 1150<br>0<br>250<br>1400<br>5 | <1E14 |
| 10 | Ru(C5H4C2H5)2/THF 0.1mol/1 | 1nm~2nm | N2 CARRIER GAS(sccm)<br>OXYGEN GAS(sccm)<br>THF GAS(sccm)<br>N2 BALANCE GAS(sccm)<br>TOTAL AMOUNT OF SUPPLIED GASES(sccm)<br>PRESSURE(Torr) | 270-350 | 1150<br>0<br>250<br>1400<br>5 | 650<br>50<br>1300<br>250<br>2250<br>5 | 1150<br>0<br>250<br>1400<br>5 | <1E14 |

FIG. 8(a)

| RECIPE NO. | PRECURSOR OF CHEMICAL VAPOR DEPOSITION | RUTHENIUM SEED LAYER | EXPERIMENTAL CONDITIONS | CVD GROWTH TEMPERATURE (°C) | STEP 1: INCREASING THE WAFER TEMPERATURE | STEP 2: SUPPLYING THE PRECURSOR | STEP 3: DECREASING THE WAFER TEMPERATURE | AMOUNT OF OXYGEN CONTAMINATION atom/cm² |
|---|---|---|---|---|---|---|---|---|
| 11 | Ru(C₅H₅)₂ | 1nm~2nm | N2 CARRIER GAS(sccm)<br>OXYGEN GAS(sccm)<br>N2 BALANCE GAS(sccm)<br>TOTAL AMOUNT OF SUPPLIED GASES(sccm)<br>PRESSURE(Torr) | 220—270 | 650<br>0<br>250<br>900<br>5 | 650<br>20<br>250<br>920<br>5 | 650<br>0<br>250<br>900<br>5 | <1E14 |
| 12 | Ru(C₅H₄CH₃)₂ | 1nm~2nm | N2 CARRIER GAS(sccm)<br>OXYGEN GAS(sccm)<br>N2 BALANCE GAS(sccm)<br>TOTAL AMOUNT OF SUPPLIED GASES(sccm)<br>PRESSURE(Torr) | 220—270 | 650<br>0<br>250<br>900<br>5 | 650<br>20<br>250<br>920<br>5 | 650<br>0<br>250<br>900<br>5 | <1E14 |
| 13 | Ru(C₁₁H₁₉O₂)₃ | 1nm~2nm | N2 CARRIER GAS(sccm)<br>OXYGEN GAS(sccm)<br>N2 BALANCE GAS(sccm)<br>TOTAL AMOUNT OF SUPPLIED GASES(sccm)<br>PRESSURE(Torr) | 220—280 | 650<br>0<br>250<br>900<br>5 | 650<br>20<br>250<br>920<br>5 | 650<br>0<br>250<br>900<br>5 | 5.0E+14 |
| 14 | Ru(OD)₃ | 1nm~2nm | N2 CARRIER GAS(sccm)<br>OXYGEN GAS(sccm)<br>N2 BALANCE GAS(sccm)<br>TOTAL AMOUNT OF SUPPLIED GASES(sccm)<br>PRESSURE(Torr) | 240—300 | 650<br>0<br>250<br>900<br>5 | 650<br>20<br>250<br>920<br>5 | 650<br>0<br>250<br>900<br>5 | 6.0E+14 |
| 15 | Ru(C₅H₄C₂H₅)₂<br>/CH3OH 0.1mol/1 | 1nm~2nm | N2 CARRIER GAS(sccm)<br>OXYGEN GAS(sccm)<br>N2 BALANCE GAS(sccm)<br>CH3OH GAS(sccm)<br>TOTAL AMOUNT OF SUPPLIED GASES(sccm)<br>PRESSURE(Torr) | 250—350 | 1150<br>0<br>250<br>—<br>1400<br>5 | 650<br>100<br>250<br>2800<br>3800<br>5 | 1150<br>0<br>250<br>—<br>1400<br>5 | <1E14 |

FIG. 8(b)

| RECIPE NO. | PRECURSOR OF CHEMICAL VAPOR DEPOSITION | RUTHENIUM SEED LAYER | EXPERIMENTAL CONDITIONS | CVD GROWTH TEMPERATURE (°C) | STEP 1: INCREASING THE WAFER TEMPERATURE | STEP 2: SUPPLYING THE PRECURSOR | STEP 3: DECREASING THE WAFER TEMPERATURE | AMOUNT OF OXYGEN CONTAMINATION atom/cm² |
|---|---|---|---|---|---|---|---|---|
| 16 | Ru(C₅H₄C₂H₅)₂ /C₈H₁₈ 0.1mol/l | 1nm~2nm | N₂ CARRIER GAS(sccm)<br>OXYGEN GAS(sccm)<br>C₈H₁₈ GAS(sccm)<br>N₂ BALANCE GAS(sccm)<br>TOTAL AMOUNT OF SUPPLIED GASES(sccm)<br>PRESSURE(Torr) | 250–350 | 1150<br>0<br>250<br>1400<br>5 | 650<br>50<br>690<br>250<br>1640<br>5 | 1150<br>0<br>250<br>1400<br>5 | <1E14 |
| 17 | Ru(C₅H₅)₂/THF 0.1mol/l | 1nm~2nm | N₂ CARRIER GAS(sccm)<br>OXYGEN GAS(sccm)<br>THF GAS(sccm)<br>N₂ BALANCE GAS(sccm)<br>TOTAL AMOUNT OF SUPPLIED GASES(sccm)<br>PRESSURE(Torr) | 260–350 | 1150<br>0<br>250<br>1400<br>5 | 650<br>50<br>1300<br>250<br>2250<br>5 | 1150<br>0<br>250<br>1400<br>5 | <1E14 |
| 17 | Ru(C₁₁H₁₉O₂)₃ /THF 0.1mol/l | 1nm~2nm | N₂ CARRIER GAS(sccm)<br>OXYGEN GAS(sccm)<br>THF GAS(sccm)<br>N₂ BALANCE GAS(sccm)<br>TOTAL AMOUNT OF SUPPLIED GASES(sccm)<br>PRESSURE(Torr) | 220–350 | 1150<br>0<br>250<br>1400<br>5 | 650<br>50<br>1300<br>250<br>2250<br>5 | 1150<br>0<br>250<br>1400<br>5 | 3.0E+14 |
| 18 | Ru(CD)₃/THF 0.1mol/l | 1nm~2nm | N₂ CARRIER GAS(sccm)<br>OXYGEN GAS(sccm)<br>THF GAS(sccm)<br>N₂ BALANCE GAS(sccm)<br>TOTAL AMOUNT OF SUPPLIED GASES(sccm)<br>PRESSURE(Torr) | 220–350 | 1150<br>0<br>250<br>1400<br>5 | 650<br>50<br>1300<br>250<br>2250<br>5 | 1150<br>0<br>250<br>1400<br>5 | 4.0E+14 |

ENLARGED FIGURE OF FIG. 14(b)

FABRICATING METHOD OF SEMICONDUCTOR INTEGRATED CIRCUITS

BACKGROUND OF THE INVENTION

1. Field of the Invention

The present invention relates to a fabricating technology of a semiconductor integrated circuit. More particularly, it relates to a technology effectively adaptable for fabricating process a semiconductor integrated circuit with a step of forming a ruthenium electrode of a capacitor with high-k material by a chemical vapor deposition (CVD) method using an organoruthenium (Ru) compound as a precursor.

2. Description of the Related Art

A DRAM (Dynamic Random Access Memory) is so configured that each one of its memory cells comprising a selective transistor and an information storage capacitor (below, referred to as a capacitor) are arranged in a matrix on a semiconductor substrate. The capacitance of the memory cell capacitor needs to be increased in density for configuring a large capacity DRAM. A method teaches using a tantalum pentoxide ($Ta_2O_5$) film with a high dielectric constant as a dielectric film of a capacitor in JP-A-244364/1994.

In the foregoing publication, a polysilicon is adapted as a bottom electrode, and a process is adopted in which a silicon nitride film is formed on the surface by a thermal nitriding method using ammonia in order to prevent electrode oxidation. However, since the silicon nitride film has a lower dielectric constant than the tantalum pentoxide film, the total capacitor capacitance is reduced. Further, an oxide dielectric, such as the tantalum pentoxide film, is required to undergo film formation and post annealing in an oxidation atmosphere at a high temperature of at least 300° C. to 700° C. for improving the electrical characteristics thereof. In the step, the silicon nitride film is oxidized to a silicon oxynitride (SiON) film with a relatively lower dielectric constant, which inevitably further decreases the capacitor's capacitance.

As such, a study has been done on a MIN (Metal Insulator Metal) structure using, as a bottom electrode material, platinum (Pt) which is relatively stable at a high temperature and in an oxidation atmosphere, ruthenium (Ru), or iridium (Ir) which holds electrical conductivity even if an oxide thereof is formed. In the MIM structure, an insulator with low dielectric constant is not formed in the interface between an electrode and a dielectric film, and hence it is possible to increase the density of the capacitor capacitance. Further more, out of these metals, ruthenium, which is excellent in micromachinability, is the most preferable material as a bottom electrode of the oxide dielectric.

The present inventors have studied the application of the capacitor made up of a ruthenium electrode and a high-k dielectric material described above to a large capacity semiconductor integrated circuit, such as a 256 M bit DRAM or 1 G bit DRAM. For such a large capacity DRAM, the electrode is required to be formed three dimensionally in order to provide the required capacitor's capacitance. The present inventors have conducted a study on a technology of forming a ruthenium electrode by a Chemical Vapor Deposition (CVD) method. Below, the technology of forming a capacitor of the invention is described, and the problems and deficiencies thereof are pointed out.

A method in which a deep hole is processed in a silicon dioxide film during a step of sub-micron patterning from its surface, and then a bottom electrode of ruthenium is deposited to form a three dimensional structure is described by reference to FIGS. 16(a) to 16(e) as follows. All the figures denote cross sectional views. Further, only a capacitor forming area is shown, and other areas are omitted.

First, a silicon dioxide film having a through hole 7 in which a plug 1 made of a polysilicon (Poly-Si) and a barrier layer 19 made of, for example, titanium nitride (TiN) are buried. On an interlayer insulator of a plug region 2 made of the silicon dioxide film, an interlayer insulator of a capacitor region 3 made of, for example, a silicon dioxide film and with a film thickness of 1000 nm, is deposited (FIG. 16(a)).

The laminated plug (the plug 1 and the barrier layer 19) is formed for ensuring the electrical connection between a diffusion layer of a selective transistor (not shown) and the bottom electrode of a capacitor. The barrier layer 19 on top of the plug 1 is necessary for inhibiting the silicidization reaction between the bottom electrode of ruthenium and the Poly-Si plug 1.

Then, by using a known photolithography method and a dry etching method, the interlayer insulator of the capacitor region 3 is processed to the surface of the interlayer insulator of plug region 2 such that the resulted window is in a form of cylinder, elliptical cylinder, or rectangle (as a deep hole 8) (FIG. 16(b)).

Then, a ruthenium film 4a of 30 nm thick is deposited in the deep hole 8. The ruthenium film 4a is deposited by a CVD method using, for example, $Ru(C_5H_4C_2H_5)_2$ as a precursor (FIG. 16(c)).

Then, in order to isolate the adjacent capacitors from each other, the ruthenium film 4a deposited on the top face of the interlayer insulator of the capacitor region 3 is removed by sputtering etching, thereby forming a bottom electrode of ruthenium 4 having a three dimensional structure in the deep hole 8 (FIG. 16(d)).

Then, a high-k dielectric film 5 of 10 nm thick made of, for example, tantalum pentoxide ($Ta_2O_5$) is deposited thereon by a CVD method. Subsequently, annealing for the crystallization thereof is performed at 400° C. to 700° C., and then, a top electrode 6 made of, for example, ruthenium is deposited thereon by a CVD method, thereby completing a capacitor (FIG. 16(e)).

The resistance of the laminated plug connecting between the bottom electrode of ruthenium 4 and the selective transistor is determined for the capacitor formed in the foregoing manner. As a result, they are not well conducted. Further, the leakage current of the capacitor is determined by applying a voltage of +1 V to the top electrode 6 of the capacitor, which incurs a leakage current of $3\times10^{-3}$ A/$CM^2$ is flown therethrough, i.e. the capacitor is not well insulated. According to the cross section of the capacitor closely observed by means of a transmission electron microscope (TEM), an oxide layer of TiN, ex. titanium dioxide ($TiO_2$), is formed in the interface between the bottom electrode of ruthenium 4 and the barrier layer 19 such that peeling occurs locally. For comparison, after forming the bottom electrode of ruthenium 4 (after FIG. 16(d)), one-minute annealing at 500° C. is performed in an inert gas without forming the high-k dielectric film (tantalum pentoxide film) 5. However, even this process similarly causes the capacitor being poorly insulated. Further, as a result of the transmission electron microscope (TEM) analysis, peeling due to shrinkage of the ruthenium film itself happens. An X-ray diffraction diagram of the structure shows a peak corresponding to $TiO_2$ and a slight peak corresponding to $RuO_2$ other than the peak corresponding to ruthenium crystals. Consequently, it is conceivable that the oxygen contained in slight amounts in the bottom electrode of ruthenium 4 formed with the CVD method causes oxidation of the barrier layer 9. Further, it is also conceivable that the thermal shrinking of the ruthenium film is caused by oxygen diffusing into the barrier layer 9.

On the other hand, similarly, the TEM observation indicated that the crystal grain size and the surface morphology of the bottom electrode of ruthenium 4 change largely after annealing for crystallizing the high-k dielectric film (tantalum pentoxide film) 5. After forming the bottom electrode of ruthenium 4, the crystal grain size is about 10 nm, and a largely uneven surface is observed. However, the tantalum pentoxide film is then formed with the CVD method, and subjected to annealing for crystallization at a temperature of 650° C. As a result, the crystal grain size changes. Consequently, it is conceivable that the capacitor is not well insulated because the bottom electrode of ruthenium 4 is deformed during the annealing for crystallization.

SUMMARY OF THE INVENTION

It is an object of the present invention to form an electrode of ruthenium with a low amount of oxygen contamination and high thermal stability by a CVD method.

The above and other objects and novel features of the invention will be apparent from the description of this specification and the accompanying drawings.

Out of the aspects of the invention disclosed in this application, the general outlines of the typical embodiments will be described below.

A chemical vapor deposition method is adopted to reduce the amount of oxygen contamination in the ruthenium film. It is discovered that bis-(ethylcyclopentadienyl)ruthenium [$Ru(C_5H_4C_2H_5)_2$] and $Ru(OD)_3$ are in a liquid state at room temperature, bis-(cyclopentadienyl)ruthenium [$Ru(C_5H_5)_2$], bis-(methylcyclopentadienyl)ruthenium [$Ru(CH_3C_5H_4)_2$], and tris-(dipivaloylmethanate)ruthenium [$Ru(C_{11}H_{19}O_2)_3$] are in a solid state at room temperature as organoruthenium compounds which are used as precursors in the chemical vapor deposition method. Since these precursors require an oxidation ($O_2$) gas for decomposition and deposition, they are exposed to an oxygen atmosphere at a temperature of at least 200° C. or more.

Further, a sequence of an organoruthenium precursor gases are introduce with an oxidation gas and an inert gas in the CVD deposition process. The configuration of the CVD deposition apparatus is shown in FIG. 7. A vaporized organoruthenium compound is carried by a carrier gas of nitrogen, mixed with an oxygen gas at a mixer, and introduced through a distributor (shower head) onto a wafer. Further, a balance gas of nitrogen is introduced from the bottom of the wafer to adjust any unbalanced pressure distribution in a chamber. As a solid precursor, the wafer is held in a chamber with a constant temperature at from 50° C. to 100° C., and a nitrogen gas is introduced thereinto as a carrier gas to carry the vaporized organoruthenium compound into a deposition chamber. The amount of the organoruthenium compound to be supplied is controlled at $1 \times 10^{-5}$ MOL/MIN or more (as required for deposition) by the temperature of the chamber (keeping a constant temperature) and the amount of the carrier gas. As a liquid precursor, the organoruthenium compound is vaporized at a vaporizer controlled at about 150° C., and supplied in a required amount by a carrier gas of nitrogen. The temperature of the substrate is controlled by a bottom heater. It is noted that a gas introduction pipe and the deposition chamber are kept at a temperature of 150° C. or more, but not higher than the decomposition temperature of the precursor for preventing the condensation of the precursor.

The relationship between the timing of (1) a step during which the substrate is carried into the deposition chamber and then increased in temperature up to the growth temperature, (2) a step during which the precursor supply is started to deposit a ruthenium film, and (3) a step during which the precursor supply is stopped to decrease the substrate temperature and the substrate is taken out of the chamber, with respect to the amount of oxygen contamination in the ruthenium film formed. The amount of oxygen contamination is evaluated from the detected amounts of carbon monoxide (CO), oxygen ($O_2$), and water ($H_2O$) by the thermal deposition analysis (TDS) of the ruthenium film. The relationships between the recipes studied by using $Ru(C_5H_4C_2H_5)_2$ as a precursor of the chemical vapor deposition process and the amount of oxygen contamination in the ruthenium film are summarized in the Recipes 1 to 8 of FIGS. 5(*a*)&(*b*). The growth temperature is 250° C. Herein, the time for increasing the wafer temperature is set at 4 minutes, and the time for decreasing the temperature is set at 2 minutes. Further, the precursor supply time is adjusted such that the ruthenium film thickness is 30 nm. Further, a carrier gas of nitrogen is also introduced from the distributor (shower-head) when the precursor is not supplied so as to prevent the occurrence of any unbalanced pressure distribution in the deposition chamber. Still further, the pressure in the chamber is controlled at 5 Torr by an exhaust valve. It is noted that the amount of the supplied vaporized precursor gas is negligible as compared with the total amount of supplied gases.

The amount of oxygen in the ruthenium film is decreased to less than the detection limit ($10^{14}$ATOM/$CM^2$) where the introduction of an oxygen gas is limited to when the precursor (Recipe 4) is being supplied (FIG. 5(*a*)). The reason why the amount of oxygen contamination is increased when the oxidation gas is introduced before supplying the precursor (Recipe 2) is explained as follows. Since the amount of oxygen adsorption on the surface in the initial deposition stage is too large, oxygen is mixed into the ruthenium film. Assuming the introduction of the oxidation gas after stopping the precursor supply (Recipe 3) results in exposure of the ruthenium film to an oxygen atmosphere at 250° C., the ruthenium film surface is thus oxidized.

On the other hand, the difference between Recipes 4 and 5 is the supply amount of oxygen gas during deposition, which indicates that the amount of oxygen contamination in the ruthenium film decreases along with a decrease in the supply of oxygen gas. FIG. 6 shows the relationship between the growth rate and the inverse of the growth temperature (Arrhenius plot). When the supply of oxygen gas is 500 sccm (standard cc/minute) (Recipe 5), the surface reaction process with an activation energy of 0.4 eV at 300° C. or less proceeds. On the other hand, when the supply of oxygen gas is reduced to 20 sccm (Recipe 4), the reaction process is changed into the reaction process having an activation energy of 1.4 eV. As reported in "PROCEEDING IN VLSI TECH. 2000", p102, by M. HIRATANI et. al., the decomposition process of an organoruthenium compound, such as $Ru(C_5H_4C_2H_5)_2$, is rate-controlled by the amount of oxygen adsorption on the surface. For a large supply of oxygen gas (500 sccm), oxygen undergoes saturated adsorption on the grown surface such that oxidation decomposition is dominant. In this case, the oxygen not used for decomposition remains in the ruthenium film, and it supposedly oxidizes the ruthenium film during the growth. On the other hand, when the supply of oxygen gas is 20 sccm, supposedly, the amount of oxygen adsorption on the grown surface is limited to an amount required for the precursor decomposition, and hence the amount of oxygen to be mixed into the ruthenium film is small. The smaller the oxygen partial pressure in the deposition chamber, the more the step coverage of the ruthenium film is increased. Therefore, the smaller oxygen partial pressure is advantageous for ruthenium formation in a deep hole. As a result of a close study, it is possible to form a desired ruthenium film by adjusting the supply of oxygen gas and the supply of nitrogen gas such that the oxygen partial pressure in the deposition chamber is 0.1 Torr or less.

The results of the invention remain the same even if a seed layer is pre-formed by a sputtering method before forming the ruthenium film by the CVD method. For example, if a ruthenium film of 20 nm thick is formed on the structure of FIG. 13(b) by a sputtering method, a ruthenium seed layer of 1 nm to 2 nm thick is formed on the inner surface of the deep hole. The formation of the ruthenium seed layer allows a prior formation of a plurality of growth nucleuses in the subsequent CVD deposition. Therefore, it is possible to reduce the incubation time. The results of the investigation on the relationship between the oxygen introduction method and the amount of oxygen contamination when the ruthenium seed layer is formed are shown in Recipes 6, 7, and 8 of FIG. 5(b). In the case where an oxygen gas is introduced prior to the precursor supply (Recipe 6), the amount of oxygen contamination is increased even compared with the case where there is no ruthenium seed layer (Recipe 2). This is attributable to the fact that the ruthenium seed layer is oxidized in an oxygen atmosphere. It is found that the amount of oxygen in the ruthenium film is reduced to less than detection limit ($10^{14}$ ATOM/$CM^2$) in the case where the introduction of the oxidation gas is limited to when the precursor (Recipe 8) is being supplied.

A chemical vapor deposition method using a diluted precursor of an organoruthenium compound dissolved in a solvent is adopted by the present invention. Description is given by an example in which a diluted precursor of $Ru(C_5H_4C_2H_5)_2$ is dissolved in a tetrahydrofuran (THF) solvent with a concentration of 0.1 MOL/L. The diluted precursor is supplied at a rate of 5 sccm by means of a CVD apparatus shown in FIG. 7. The supply amount is controlled by a liquid mass flow meter. The diluted precursor is vaporized by the vaporizer held at 150° C., and then mixed with an oxygen gas together with a carrier gas of nitrogen at the mixer. The mixture is then supplied through the distributor (shower-head) into the chamber. As distinct from the case where a solvent is not used, the supply of a large amount of solvent molecules is started simultaneously with the start of the precursor supply. In this case, the amount of supplied THF gas ($6\times10^{-2}$ MOL/MIN) corresponds to 1300 sccm. Therefore, the partial pressure of each supplied gas in the deposition chamber is required to be immediately adjusted to be constant. The total amount of molecules of the supplied gases after starting deposition is desirably set to be almost the same as or more than the total amount of molecules of supplied gases before starting deposition, although it depends upon the volume of the deposition chamber and the discharge amount of a vacuum pump. For keeping the pressure constant, the exhaust amount is increased to not less than a given amount by the exhaust valve automatically. Accordingly, it is possible to immediately set the partial pressure of each supplied gas constant. The gas introduction method is as shown in Recipe 9 of FIG. 5(b). A solvent gas also has a property of inclining to be adsorbed by the grown surface. Therefore, even if the supply of oxygen gas is larger as compared with the case where no solvent is used, the surface adsorption oxygen density is low since the surface is occupied by the solvent gas first. Accordingly, the amount of oxygen contamination in the ruthenium film is also small. The growth temperature in this case is 290° C.

A close study indicates that the supply of oxygen gas, the supply of nitrogen gas, and the supply of THF gas may be adjusted such that the oxygen partial pressure in the deposition chamber is not more than 0.5 Torr. The introduction of the solvent gas allows the substrate surface adsorption density of oxygen to be controlled low, and hence it is also advantageous for the step coverage. As in the foregoing case, it is also found that the amount of oxygen in the ruthenium film is reduced to less than detection limit ($10^{14}$ ATOM/$CM^2$) in the case where the introduction of the oxygen gas is limited to when the precursor (Recipe 9) is being supplied. The same effects have been also observed for the case where the ruthenium seed layer is previously formed (Recipe 10).

The foregoing description is given by using $Ru(C_5H_4C_2H_5)_2$ as a typical example as a precursor of the chemical vapor deposition process. However, the same effects are applicable to $Ru(OD)_3$, and $Ru(CH_3C_5H_4)_2$, $Ru(C_5H_5)_2$, and $Ru(C_{11}H_{19}O_2)_3$, which are in a solid state at room temperature, but not for $Ru(C_5H_4C_2H_5)_2$. Further, the combination of the organoruthenium compound and a solvent, the solvent is not limited to THF. The same effects are applicable to methanol, ethanol, propanol, butanol, toluene, acetone, octane, diethyl ether, dimethyl ether, or the like. The optimum CVD conditions with respect to the supply of the precursors are summarized in FIGS. 8(a)&(b). The recipes 11-14 have the same conditions as the recipe 8 except the precursors. The recipes 17-19 have the same conditions as the recipe 9 except the precursors. The recipes 15, 16 have different precursors and solvents from the recipes 1-10, 11-14 or 17-19. All recipes 11-18 are designed for forming a bottom electrode. Herein, for the compounds containing oxygen in the organic molecule, such as $Ru(OD)_3$ and $Ru(C_{11}H_{19}O_2)_3$, the result is that the oxygen is left in slight amounts in the film. However, it is possible to remove oxygen included in slight amounts therein by annealing the bottom electrode of ruthenium as described below.

In the foregoing process, although oxygen ($O_2$) is used for decomposition of the precursor of the chemical vapor deposition process, the same effects are applicable to the oxidation gas, such as $N_2O$, $H_2O$, $NO_2$, or $O_3$. However, for $H_2O$, $NO_2$, or $O_3$, its supply has to be suppressed as compared with oxygen in order to inhibit the oxidation of the barrier layer. For $N_2O$, even if its supply is larger than the supply of oxygen, it is possible to inhibit oxidation of the barrier layer. This is due to a difference in their oxidizing power, and a difference in the diffusion barrier property of the ruthenium surface onto which an oxidation gas is adsorbed against the oxidation gas between respective oxidation gases. Further, nitrogen gas ($N_2$) is used as an inert gas in the foregoing example, but it is also acceptable that He, Ar, Ne, or Xe, which is a rare gas, is used instead.

The method in which oxygen is not allowed to be included in the ruthenium film shown above is especially effective when a bottom electrode of ruthenium is formed on the barrier layer. For a top electrode formed on a high-k dielectric film, an oxygen gas is desirably introduced at both the times when increasing and decreasing the temperature in order to avoid the reduction of the high-k dielectric film.

With respect to the dependence of the ruthenium film on annealing, the bottom electrode of ruthenium (just after being formed) is made up of crystal grains each in the form a cylinder with a diameter of about 10 nm and a height of about 30 nm in the direction perpendicular to the film surface. The surface is coarse because of a difference in height between respective crystal grains. However, if a tantalum pentoxide film is formed by a CVD process and subjected to annealing for crystallization thereof at a temperature of 650° C., the size of each crystal grain is changed to 30 nm or more. Then, a study has been conducted on a method for forming a film, which undergoes no crystal deformation and has high thermal stability, by annealing a bottom electrode of ruthenium before forming a tantalum pentoxide film.

FIG. 9 shows the relationship between the annealing temperature in an inert atmosphere and the density of the ruthenium film. The ruthenium film is formed in accordance to Recipe 10 of FIG. 5(b) by using a diluted precursor of $Ru(C_5H_4C_2H_5)_2$ dissolved in a THF solvent. Further, the density of the ruthenium film is determined by an X-ray total reflection analysis. FIG. 9 shows the respective changes in density when a TaN film is used as a barrier film and when the ruthenium film is formed on a silicon dioxide film. The respective densities of the ruthenium films just after being formed (formation temperature: 290° C.) are 9.7 g/cm$^2$ (on the TaN film) and 8.8 g/cm$^2$ (on the silicon dioxide film). It is found that the densities increase at an annealing temperature of not less than the formation temperature, and become a constant value of 10.5 g/cm$^2$ at 400° C. or more.

FIG. 10 shows the relationship between the annealing temperature in an inert atmosphere and the crystal grain size. The ruthenium film is formed in accordance with Recipe 10 of FIG. 5B, and the crystal grain size of the ruthenium film is determined through the cross-section TEM observation of the ruthenium film. The size of the crystal grain (just after being formed) is about 10 nm, and the surface thereof is also coarse. However, by performing annealing at not less than the formation temperature, the size of each crystal grain increases, and the crystal grains become uniform with an average grain size of 40 nm, while ranging from 30 nm to 60 nm, at 400° C. Further, it is also found that no change occurs at a temperature higher than 400° C. (i.e. from 400° C. to 800° C.).

FIG. 11 shows the relationship between the leakage current of the capacitor using a tantalum pentoxide film as a high-k dielectric film, and a ruthenium film as a top electrode (a voltage of +1 V is applied to the top electrode side), and the annealing temperature after the formation of a bottom electrode of ruthenium. The tantalum pentoxide film is formed by using $Ta(OC_2H_5)_5$ and $O_2$ as precursor gases at a temperature of 400° C. to 450° C. The film is 10 nm thick. The tantalum pentoxide film is formed, and then subjected to 650° C. annealing for crystallization in nitrogen, further followed by 600° C. annealing for oxidization. FIG. 11 indicates that the leakage current is decreased by performing the annealing at not less than the formation temperature of the ruthenium film. Then, it is found that the magnitude of the leakage current is controlled to 10$^{-7}$ A/cm$^2$ or less at an annealing temperature of 400° C. to 800° C. The results are consistent with the conditions under which the density of the ruthenium film and the crystal grain size become constant as shown in FIGS. 9 and 10.

The foregoing results occur whether the underlying film is the barrier film or the silicon dioxide film. Further, the same effects are applicable to $Ru(OD)_3$, and $Ru(CH_3C_5H_4)_2$, $Ru(C_5H_5)_2$, and $Ru(C_{11}H_{19}O_2)_3$, which are in a solid state at room temperature but not for $Ru(C_5H_4C_2H_5)_2$. Thus, the results are not limited to the above-mentioned precursor of chemical vapor deposition. Further, for the combination of the organoruthenium compound and a solvent, the solvent is not limited to THF. The same effects are also applicable to methanol, ethanol, 1-propanol, 2-propanol, isobutyl alcohol, 1-butanol, 2-butanol, diethyl ether, diisopropyl ether, octane, tetrahydropyran, 1,4-dioxane, acetone, methyl ethyl ketone, and toluene.

In summary, it is found that by subjecting a ruthenium film to annealing at not less than the formation temperature in an inert atmosphere after forming the ruthenium film by the CVD method, it is possible to form a ruthenium film with high thermal stability against the annealing for crystallization during or after the subsequent high-k dielectric film formation. The foregoing effects do not depend upon the materials of the precursor of chemical vapor deposition or the underlying film. If the annealing temperature immediately after forming the ruthenium film is set at not more than the temperature of annealing for crystallization after forming the high-k dielectric film, the thermal load can be reduced. Therefore, an effect of inhibiting the oxidation of the barrier film by the oxygen included in the ruthenium film is also exerted.

Other and further objects, features and advantages of the invention will appear more fully from the following description.

BRIEF DESCRIPTION OF THE DRAWINGS

The preferred embodiments of the present invention are illustrated in the accompanying drawings in which:

FIG. 1 is a graph showing a gas introduction process of Embodiment 1 of the present invention;

FIG. 2 is a graph showing a gas introduction process of Embodiment 2 of the present invention;

FIGS. 4(a) and 4(b) are graphs respectively showing gas introduction process of Embodiment 4 of the present invention;

FIGS. 5(a) and 5(b) are tables showing the relationship between the deposition conditions for a chemical vapor deposition method using $Ru(C_5H_4C_2H_5)_2$ as a precursor and the amount of oxygen contamination in a respective ruthenium film;

FIGS. 8(a) and 8(b) are tables showing the relationship between the deposition conditions for a chemical vapor deposition method using various precursors and the amount of oxygen contamination in a respective ruthenium film;

DETAILED DESCRIPTION OF THE PREFERRED EMBODIMENTS

Figure 3A:
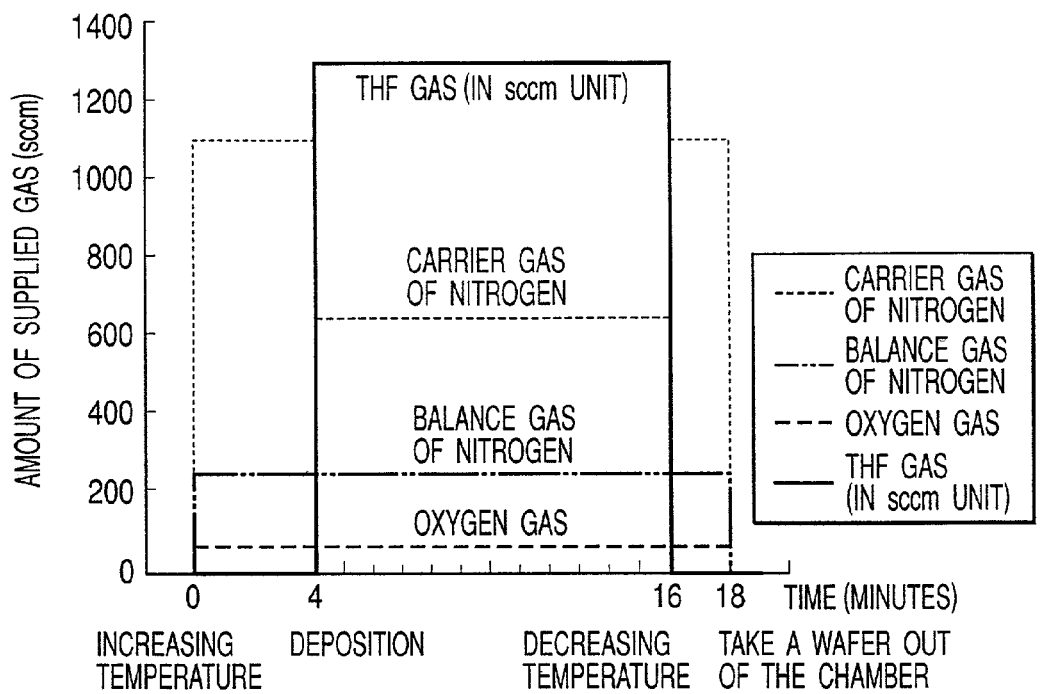
FIGS. 3(a) and 3(b) are graphs respectively showing gas introduction process of Embodiment 3 of the present invention.

Below, the embodiments of the present invention are described in detail by reference to drawings. It is noted that elements having like functions are given like reference numerals in all the drawings for illustrating the embodiments, and any repetition of similar description is avoided.

Embodiment 1

Figure 7:
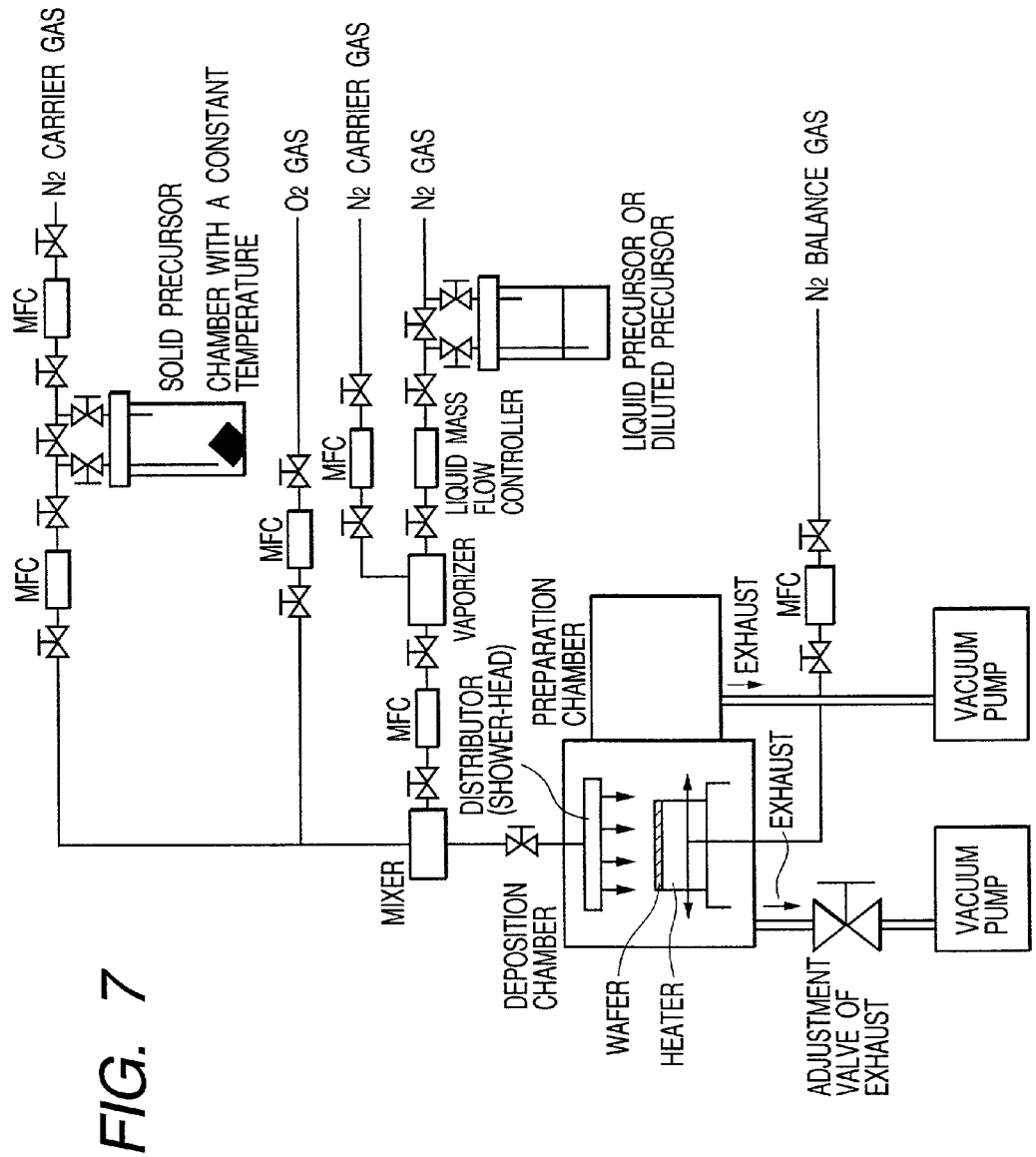
FIG. 7 is a diagram showing the configuration of a ruthenium film formation apparatus using a chemical vapor deposition method.

In this embodiment, a diluted liquid precursor, a precursor gas, an oxidation gas, and an inert gas are introduced to form a bottom electrode of ruthenium by a CVD method. FIG. 7 shows the configuration of an apparatus for forming a ruthenium film on a wafer. A diluted precursor of $Ru(C_5H_4C_2H_5)_2$ dissolved in a THF solvent with a concentration of 0.1 mol/l is used as a precursor. Each gas is supplied into the system as follows. The diluted precursor supplied at a flow rate controlled by a liquid mass flow controller (MFC) is heated and vaporized by a vaporizer. Then, the vaporized $Ru(C_5H_4C_2H_5)_2$ precursor and the THF gas are carried by a carrier gas of nitrogen, and mixed with an oxygen ($O_2$) gas which is an oxidation gas before entering a deposition chamber. Further, the mixed gas is supplied through a distributor (shower-head) onto a wafer heated by a heater. A balance gas of nitrogen is supplied through another line so as to adjust the partial pressure contributed by each gas in the deposition chamber and make constant the pressure distribution in the deposition chamber. The amounts of respective gases supplied are all controlled by the MEC. The gas introduction process for forming the ruthenium film with least oxygen contamination is as shown in FIG. 1.

A wafer (substrate) is carried into the vacuum deposition chamber, and then the wafer temperature is increased up to 290° C. over 4 minutes by a heater. At this step, the carrier gas of nitrogen and the balance gas of nitrogen are supplied at flow rates of 1150 sccm and 250 sccm, respectively, and oxygen and the diluted precursor are not yet supplied. The exhaust amount is adjusted by an adjustment valve of exhaust to control the pressure in the deposition chamber to 5 Torr. After increasing the temperature, the supply of the diluted precursor is started at a rate of 5 sccm, and simultaneously, oxygen is supplied at a rate of 50 sccm. At this step, the supply of a THF gas at a rate of $6\times10^{-2}$ mol/min corresponding to a rate of 1300 sccm is started. The partial pressure of each supplied gas in the deposition chamber is required to be immediately made constant during each step (i.e. step 1, step 2, and step 3, especially step 2-the deposition step), while the partial pressure of one gas might change from one step to the other step. The total pressure also keeps constant. As a result of the optimization, by allowing the flow rate of the balance gas of nitrogen to remain 250 sccm, and decreasing the rate of the carrier gas of nitrogen to 650 sccm, a large change in pressure is inhabited, and simultaneously immediately constant the partial pressure of each supplied gas. The pressure during deposition remained constant at 5Torr. After depositing a 30-nm-thick ruthenium film, the supplies of the diluted precursor and the oxygen gas are stopped, and the flow rate of the carrier gas of nitrogen is returned to 1150 sccm. The flow rate of the balance gas of nitrogen remained constant at 250 sccm. The wafer temperature decreases in 2 minutes to 220° C., and then the wafer is taken out. If a ruthenium seed layer is pre-formed on the wafer, the length of time between start and stop of the precursor supply is 11 minutes.

The foregoing process is characterized in that the supply of an oxygen gas is limited to when the precursor is supplying while the partial pressure of each supplied gas is controlled to be constant during formation of a bottom electrode of ruthenium i.e. the deposition period. Further, it is also important that the oxygen partial pressure during deposition is gradually reduced. The characteristics of the ruthenium film depend upon the amount of oxygen adsorption onto the surface, which is determined by the supply of oxygen gas, the supply of THF, and the supply of nitrogen gas. Particularly, the step coverage is enhanced with a decrease in oxygen partial pressure. Therefore, the optimum conditions for the amount of each supplied gas varies according to the aspect ratio of a three-dimensional bottom electrode. For example, the supply of oxygen gas may be reduced or the supply of THF (supply of the precursor) may be increased in order to increase the step coverage. At this step, in order to control the pressure in the deposition chamber and the partial pressure of each supplied gas to be constant, it is desirable that the nitrogen gas supplied before starting the deposition is almost the same as (or less than) the total amount of other gases supplied after starting the deposition.

According to the foregoing process, it is possible to form a bottom electrode of ruthenium of which the amount of oxygen contamination is less than the detection limit of a TDS method such that it will not oxidize a barrier film. The foregoing process is not limited to $Ru(C_5H_4C_2H_5)_2$. It if also applicable to $Ru(OD)_3$, $Ru(CH_3C_5H_4)_2$, $Ru(C_5H_5)_2$, and $Ru(C_{11}H_{19}O_2)_3$ in a solid state at room temperature And other solvents, such as methanol, ethanol, 1-propanol, 2-propanol, isobutyl alcohol, 1-butanol, 2-butanol, diethyl ether, diisopropyl ether, octane, tetrahydropyran, 1,4-dioxane, acetone, methyl ethyl ketone, and toluene can be used to substitute THF. However, the amount of supplied gases during deposition and the growth temperature depend upon the precursor. The reaction of the gases and the oxygen for Ru disposition is determined by the amount of oxygen supply rather than the oxygen reaction speed on the surface. Therefore, they are required to be adjusted so as to satisfy the conditions capable of achieving the oxygen-supply-controlled reaction at a low oxygen partial pressure.

Embodiment 2

In this embodiment, a precursor gas, an oxidation gas, and an inert gas are introduced to form a bottom electrode of ruthenium. FIG. 7 shows the configuration of an apparatus. The case where a liquid precursor $Ru(C_5H_4C_2H_5)_2$ is loaded in a precursor container is taken as an example. $Ru(C_5H_4C_2H_5)_2$ is heated and vaporized by a vaporizer held at 150° C., and carried by using a nitrogen gas as a carrier gas into a mixer. The flow rate is controlled by a mass flow controller (MFC). Then, the mixed gas is mixed with an oxygen gas, which is a reaction gas, before entering a deposition chamber. The precursor, oxygen gas, and the carrier gas of nitrogen are supplied through a distributor (shower-head) onto a wafer heated by a heater. The partial pressure of each gas in the deposition chamber is adjusted by making constant the flow rate of a balance gas of nitrogen supplied through another line and the total pressure in the deposition chamber. The amounts of respective gases supplied are all controlled by the MFC. The gas introduction sequence for forming the ruthenium film with least oxygen contamination shown in FIG. 2.

A wafer is carried into the vacuum deposition chamber, and then the carrier gas of nitrogen and the balance gas of nitrogen are supplied at rates of 650 sccm and 250 sccm, respectively, while oxygen and the precursor are not supplied. In such a state, the wafer temperature is increased up to 250° C. over 4 minutes by a heater. The exhaust amount is adjusted by an adjustment valve of exhaust to control the pressure in the deposition chamber to 5 Torr. After increasing the temperature, the supply of the precursor is started, and simultaneously, the supply of oxygen is started at a rate of 20 sccm. The supply of the precursor is restricted to the amount required for deposition, and hence it is slight as compared with the amount of molecules of other supplied gases. Therefore, before and after the start of the precursor, there is no large change in the amount of molecules of supplied gases, and there is no large variation in pressure. After depositing a 30-nm-thick ruthenium film, the supplies of the diluted precursor and an oxygen gas are stopped. The flow rates of the carrier gas of nitrogen and the balance gas of nitrogen remain constant at 650 sccm and 250 sccm, respectively. The wafer is decreased in temperature to 220° C. for 2 minutes, and then the wafer is taken out. When a ruthenium seed layer is pre-formed on the wafer, the length of time between start and stop of the precursor supply is 11 minutes.

The foregoing process is characterized in that the supply of an oxygen gas is limited to when the precursor is supplying during formation of a bottom electrode of ruthenium. Further, it is also important that the oxygen partial pressure during deposition is gradually reduced. The characteristics of the ruthenium film depend upon the amount of oxygen adsorption onto the surface, which is determined by the supply of oxygen gas and the supply of nitrogen gas. Particularly, the step coverage is enhanced with a decrease in oxygen partial pressure. Therefore, the optimum conditions for the amount of each supplied gas varies according to the aspect ratio of a three-dimensional bottom electrode. For example, the supply of oxygen gas described above may be reduced in order to increase the step coverage.

According to the foregoing process, it is possible to form a bottom electrode of ruthenium of which the amount of oxygen contamination is less than detection limit of a TDS method such that it will not oxidize a barrier film. The foregoing process is not limited to $Ru(C_5H_4C_2H_5)_2$. It is also applicable to $Ru(OD)_3$, $Ru(CH_3C_5H_4)_2$, $Ru(C_5H_5)_2$, and $Ru(C_{11}H_{19}O_2)_3$ in a solid state at room temperature. However, the amount of supplied gases during deposition and the growth temperature depend upon the precursor. Therefore, they are required to be adjusted so as to satisfy the conditions for achieving the oxygen-supplu-controlled reaction at a low oxygen partial pressure.

Embodiment 3

In this embodiment, a diluted precursor, a precursor gas, an oxidation gas, and an inert gas are introduce to form a top electrode of ruthenium. A diluted precursor of $Ru(C_5H_4C_2H_5)_2$ dissolved in a THF solvent with a concentration of 0.1 mol/l is used as a precursor. The apparatus configuration is the same as applied in Embodiment 1. When the top electrode of ruthenium is formed, an oxygen gas has to be supplied at both the times when increasing and decreasing the temperature of the wafer in order to inhibit an increase in the leakage current due to the reduction of the high-k dielectric film, such as a tantalum pentoxide film. The gas introduction process for forming the top electrode of ruthenium is as shown in FIG. 3(a).

A wafer is carried into the vacuum deposition chamber, and then the wafer temperature is increased up to 290° C. over 4 minutes by a heater. At this step, the carrier gas of nitrogen and the balance gas of nitrogen are supplied at rates of 1100 sccm and 250 sccm, respectively. Further, an oxygen gas is supplied at a rate of 50 sccm. The exhaust amount is adjusted by an adjustment valve of exhaust to control the pressure in the deposition chamber to 5 Torr. After increasing the temperature, the supply of the precursor is started at a rate of 5 sccm. The flow rate of the balance gas of nitrogen remains 250 sccm, and the rate of the carrier gas of nitrogen is decreased to 650 sccm. At this step, the supply of a THF gas at a rate of $6 \times 10^{-2}$ mol/min (corresponding to the rate of 1300 sccm) is also started simultaneously.

According to the foregoing gas introduction process, it is possible to inhibit a large change in pressure, and meanwhile, immediately make constant the partial pressure of each supplied gas. The total pressure during deposition remains constant at 5 Torr. After depositing a 70-nm-thick ruthenium film, the supply of the diluted precursor stops. The flow rate of the carrier gas of nitrogen returns to 1100 sccm. The flow rates of the balance gas of nitrogen and the oxygen gas remains constant at 250 sccm and 50 sccm, respectively. The wafer is decreased in temperature for 2 minutes 220° C., and then the wafer is taken out. When a ruthenium seed layer is pre-formed on the wafer, the length of time between start and stop of the precursor supply is 12 minutes.

The foregoing process is characterized in that an oxygen gas is supplied at the times when increasing and decreasing the wafer temperature, and the partial pressure of each supplied gas is controlled to be constant during formation of the top electrode of ruthenium. The supply of oxygen gas at the times when increasing and decreasing the wafer temperature is set to inhibit the reduction of a high-k dielectric film, such as a tantalum pentoxide film. Therefore, it is acceptable that the supply is larger than the described above. Further, it is also important that the oxygen partial pressure during deposition is reduced to form a top electrode of ruthenium with a good step coverage. For example, for enhancing the step coverage, the supply of oxygen gas during deposition shown above is decreased, or the supply of THF (supply of the precursor) is increased.

Consequently, it is possible to form a top electrode of ruthenium which has a good step coverage without damaging a capacitor insulator. Further, with the foregoing process, i.e., by introducing an oxygen gas before supplying the diluted precursor, oxygen is adsorbed on the grown surface prior to the precursor so as to facilitate the formation of a plurality of growth nucleus. Therefore, the foregoing process also reduces the incubation time and shorten the growth time as compared with the process shown in Embodiments 1 and 2. The foregoing process is also applicable to the formation of the bottom electrode of ruthenium by being combined with a process in which after forming an electrode of ruthenium, the oxygen included therein is removed by annealing it in an inert atmosphere as described later in Embodiment 5. In this case, in order to minimize the amount of oxygen in the ruthenium film, the supplies of oxygen gas and nitrogen gas are adjusted such that the oxygen partial pressure in the deposition chamber is 0.5 Torr or less when increasing the temperature of the wafer, and the supply of oxygen gas has to be stopped simultaneously with the precursor supply. In this case, for forming a 30-nm-thick ruthenium film, the length of time between start and stop of the precursor supply is 7 minutes.

Figure 3B:
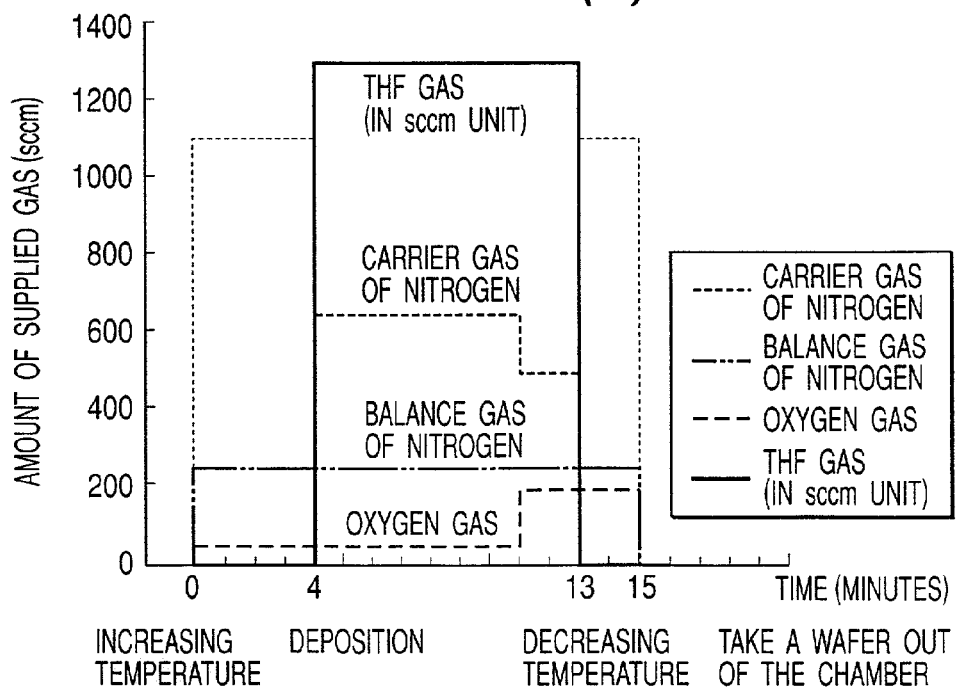
Figure 6:
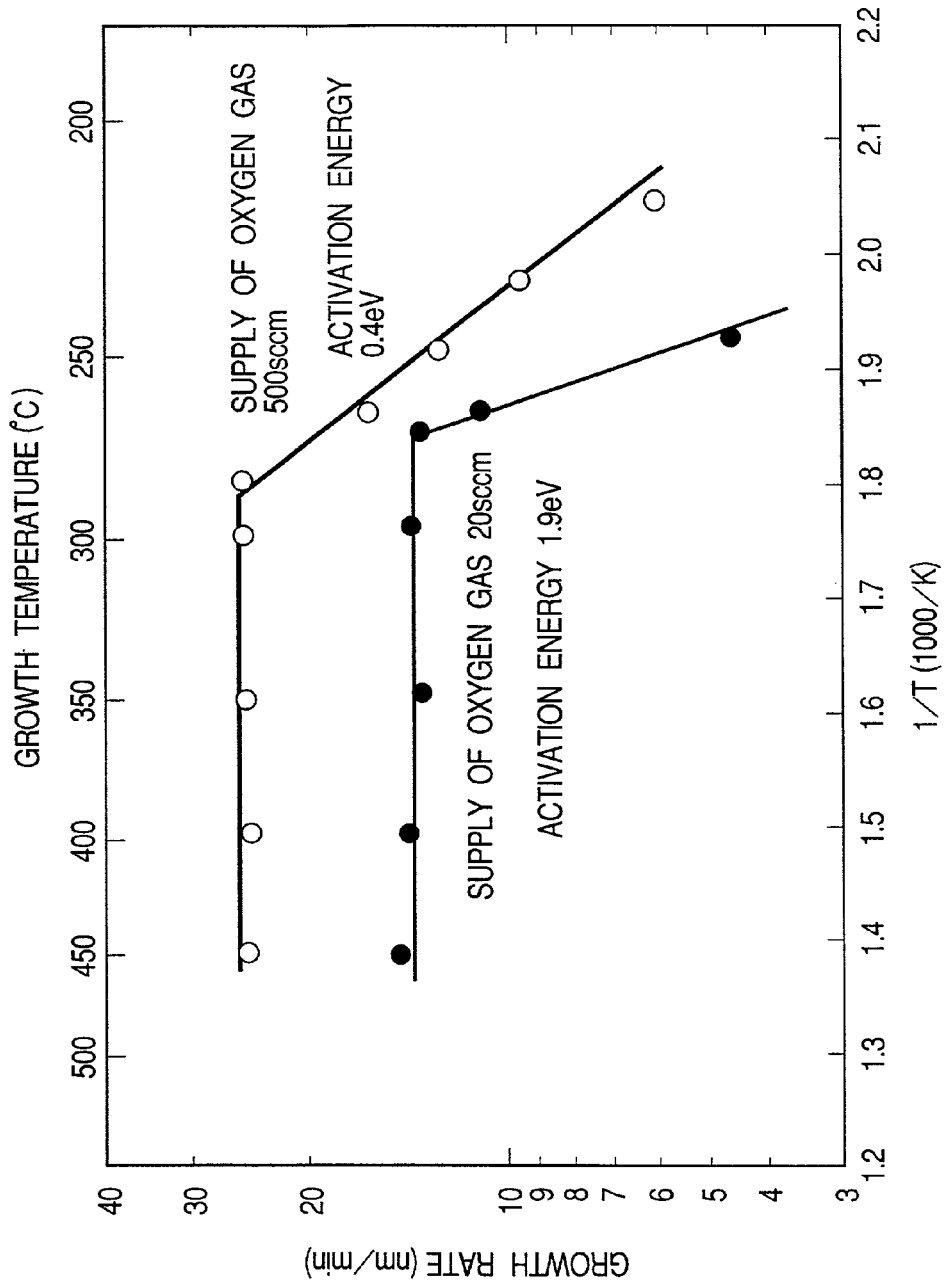
FIG. 6 is a graph showing the dependence of the growth rate of the ruthenium film on the growth temperature.

It is also possible to form the top electrode of ruthenium by using a gas supply process including a step of forming a ruthenium film with a good step coverage in a deep hole, and a step of forming a ruthenium film on a flat surface after filling in the deep hole. This gas introduction process is shown in FIG. 3(b). A wafer is carried into the vacuum deposition chamber, and then the wafer temperature is increased up to 290° C. over 4 minutes by a heater. At this step, the carrier gas of nitrogen and the balance gas of nitrogen are supplied at rates of 1100 sccm and 250 sccm, respectively. Further, an oxygen gas is supplied at a rate of 50 sccm. The exhaust amount is adjusted by an adjustment valve of exhaust to control the pressure in the deposition chamber to 5 Torr. After increasing the temperature, the supply of the diluted precursor is started at a rate of 5 sccm. The flow rate of the balance gas of nitrogen remains 250 sccm, and the rate of the carrier gas of nitrogen is decreased to 650 sccm. At this step, the supply of a THF gas at a rate of $6 \times 10^{-2}$ mol/min (corresponding to the rate of 1300 sccm) is also started simultaneously.

According to the foregoing gas introduction method, it is possible to inhibit a large change in pressure, and meanwhile, immediately make constant the partial pressure of each supplied gas. The total pressure during deposition remained constant at 5 Torr. After forming a 30-nm-thick ruthenium film with a good step coverage in the deep hole over 7 minutes while allowing the supplies of the diluted precursor and the balance gas of nitrogen to remain constant, the supply of oxygen gas is increased to 200 sccm, and the supply of the carrier gas of nitrogen is decreased to 500 sccm. This process can increase the oxygen adsorption density on the wafer surface, and hence it increases the growth rate of the film. In this state, a 40-nm-thick ruthenium film is formed over 2 minutes, and then the supply of the diluted precursor is stopped. The flow rate of the carrier gas of nitrogen is returned to 1100 sccm. The flow rates of the balance gas of nitrogen and the oxygen gas remains constant at 250 sccm and 200 sccm, respectively. The wafer is decreased in temperature for 2 minutes to 220° C., and then the wafer is taken out. The foregoing process shortens the growth time by about 3 minutes by performing deposition of the top electrode of ruthenium getting either a good step coverage with a low growth rate, or a bad step coverage with a high growth rate.

The foregoing process is not limited to $Ru(C_5H_4C_2H_5)_2$, but also applicable to $Ru(OD)_3$, $Ru(CH_3C_5H_4)_2$, $Ru(C_5H_5)_2$, and $RU(C_{11}H_{19}O_2)_3$ in a solid state at room temperature. The solvents, such as methanol, ethanol, 1-propanol, 2-propanol, isobutyl alcohol, 1-butanol, 2-butanol, diethyl ether, diisopropyl ether, octane, tetrahydropyran, 1,4-dioxane, acetone, methyl ethyl ketone, and toluene, may be used to substitute THF. However, the amount of the supplied diluted precursor and the amount of supplied gases during deposition, and the growth temperature depend upon the precursor. Therefore, they are adjusted to achieve a low oxygen partial pressure when the formation of step coverage is given a higher priority, and the are adjusted to achieve a high oxygen partial pressure when the growth rate is given a higher priority.

Embodiment 4

In this embodiment, a precursor gas, an oxidation gas, and an inert gas are introduced to form a top electrode of ruthenium. The apparatus configuration and the vaporization method of the precursor are shown in Embodiment 2. For example, if a liquid precursor $Ru(C_5H_4C_2H_5)_2$ is loaded in a precursor container to form the top electrode of ruthenium, an oxygen gas has to be supplied at both the times when increasing and decreasing the temperature of the wafer in order to inhibit an increase in the leakage current due to the reduction of the high-k dielectric film, such as a tantalum pentoxide film. The gas introduction process is as shown in FIG. 4(a).

A wafer is carried into the vacuum deposition chamber, and then the wafer temperature is increased up to 250° C. over 4 minutes by a heater. At this step, the carrier gas of nitrogen and the balance gas of nitrogen are supplied at rates of 600 sccm and 250 sccm, respectively. Further, an oxygen gas is supplied at a rate of 50 sccm. The exhaust amount is adjusted by an adjustment valve of exhaust to control the pressure in the deposition chamber to 5 Torr. After increasing the temperature, the supply of the precursor is started. Simultaneously, the supply of the oxygen gas is decreased to 20 sccm, and the supply of the carrier gas of nitrogen is increased to 630 sccm. The supply of the balance gas of nitrogen remains 250 sccm. The amount of supplied precursor is slight as compared with the amount of molecules of other supplied gases. Therefore, before and after the start of the precursor supply, there is no change in the amount of molecules of the supplied gases, and there is no large pressure variation. After depositing a 70-nm-thick ruthenium film, the supply of the diluted precursor is stopped. The flow rate of the carrier gas of nitrogen is adjusted to 600 sccm. The flow rates of the balance gas of nitrogen and the oxygen gas are adjusted to 250 sccm and 50 sccm, respectively. The wafer is decreased in temperature for 2 minutes to 220° C., and then the wafer is taken out. When a ruthenium seed layer is pre-formed on the wafer, the length of time between start and stop of the precursor supply is 12 minutes.

The foregoing process is characterized in that an oxygen gas is supplied at the times when increasing and decreasing the wafer temperature, and the partial pressure of each supplied gas is controlled to be constant during formation of the top electrode of ruthenium. The supply of oxygen gas at the times when increasing and decreasing the wafer temperature is set to inhibit the reduction of a high-k dielectric film such as a tantalum pentoxide film. Therefore, it is acceptable that the supply of oxygen gas is larger than the described above. Further, it is also important that the oxygen partial pressure during deposition is reduced to from a top electrode of ruthenium with a good step coverage. For example, for enhancing the step coverage, the supply of oxygen gas during deposition shown above is decreased. Consequently, it is possible to form a top electrode of ruthenium which has a good step coverage without damaging a capacitor insulator. Further, with the foregoing process, by introducing an oxygen gas before supplying the precursor, oxygen is previously adsorbed on the grown surface to facilitate the formation of a plurality of growth nucleuses. Therefore, the foregoing process also reduces the incubation time and shortens the growth time as compared with the processes shown in Embodiments 1 and 2.

As described later in Embodiment 5, the foregoing process is also applicable for forming a multiple-electrode structure of ruthenium by combining with another process after forming a bottom electrode of ruthenium, the oxygen included therein is removed by annealing it in an inert atmosphere. In this case, in order to minimize the amount of oxygen in the ruthenium film, the supplies of oxygen gas and nitrogen gas are adjusted such that the oxygen partial pressure in the deposition chamber is 0.5 Torr or less when increasing the temperature of the wafer, and the supply of oxygen gas has to be stopped simultaneously with the precursor supply. In this case, for forming a 30-nm-thick ruthenium film, the length of time between start and stop of the precursor supply is 7 minutes.

For forming the top electrode of ruthenium, it is also possible to use a gas supply process including a step of forming a ruthenium film with a good step coverage in a deep hole, and a step of forming a ruthenium film on a flat surface after filling in the deep hole. This gas introduction process is shown in FIG. 4(b). A wafer is carried into the deposition chamber in a vacuum, and then the wafer temperature is increased up to 250° C. over 4 minutes by a heater. At this step, the carrier gas of nitrogen and the balance gas of nitrogen are supplied at rates of 600 sccm and 250 sccm, respectively. Further, an oxygen gas is supplied at a rate of 50 sccm. The exhaust amount is adjusted by an adjustment valve of exhaust to control the pressure in the deposition chamber to 5 Torr. After increasing the temperature, the supply of the precursor is started. Simultaneously, the supply of oxygen gas is decreased to 20 sccm, and the supply of the carrier gas of nitrogen is increased to 630 sccm. The flow rate of the balance gas of nitrogen remains 250 sccm. The supply of the precursor is slight as compared with the amount of molecules of other supplied gases. Therefore, before and after the start of the precursor supply, there is no change in the amount of molecules of the supplied gases, and there is no large pressure variation. The pressure during deposition remains constant at 5 Torr.

After forming a 30-nm-thick ruthenium film with a good step coverage in each groove over 7 minutes, while allowing the supplies of the carrier gas of nitrogen and the balance gas of nitrogen to remain constant, the supply of oxygen gas is increased to 200 sccm. This process increases the oxygen adsorption density on the wafer surface, and hence increases the growth rate. In this state, a 40-nm-thick ruthenium film is formed over 2 minutes, and then the supply of the precursor is stopped. The flow rate of the carrier gas of nitrogen is adjusted to 450 sccm. The flow rates of the balance gas of nitrogen and the oxygen gas remains constant at 250 sccm and 200 sccm, respectively. The wafer is decreased in temperature for 2 minutes to 220° C., and then the wafer is taken out. The foregoing process shortens the growth time by about 3 minutes by performing deposition of the top electrode of ruthenium getting either a good step coverage with a low growth rate, or a bad step coverage with a high growth rate.

With the foregoing process, it is possible to form a top electrode of ruthenium which has a good step coverage without damaging a capacitor insulator. Further, the foregoing process is not limited to $Ru(C_5H_4C_2H_5)_2$. It can also be $Ru(OD)_3$, $Ru(CH_3C_5H_4)_2$, $Ru(C_5H_5)_2$, and $Ru(C_{11}H_{19}O_2)_3$ in a solid state at room temperature. However, the amount of supplied gases during deposition, and the growth temperature depend upon the precursor. Therefore, they are adjusted to achieve a low oxygen partial pressure when the step coverage is given a higher priority, and they are adjusted to achieve a high oxygen partial pressure when the growth rate is given a higher priority.

Embodiment 5

Figure 9:
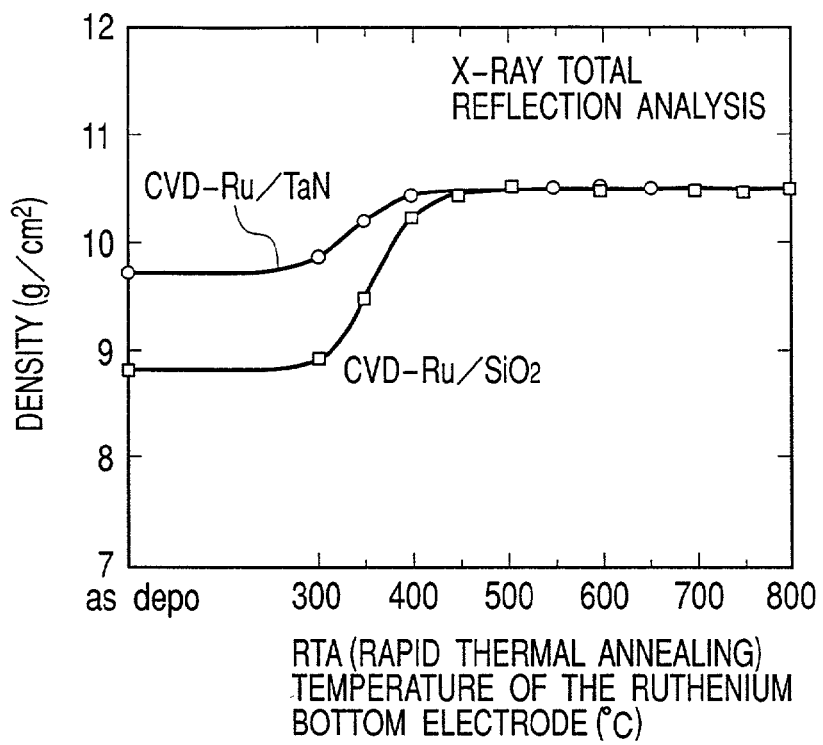
FIG. 9 is a graph showing the relationship between the annealing temperature in an inert atmosphere and the density of the respective ruthenium crystal.
Figure 10:
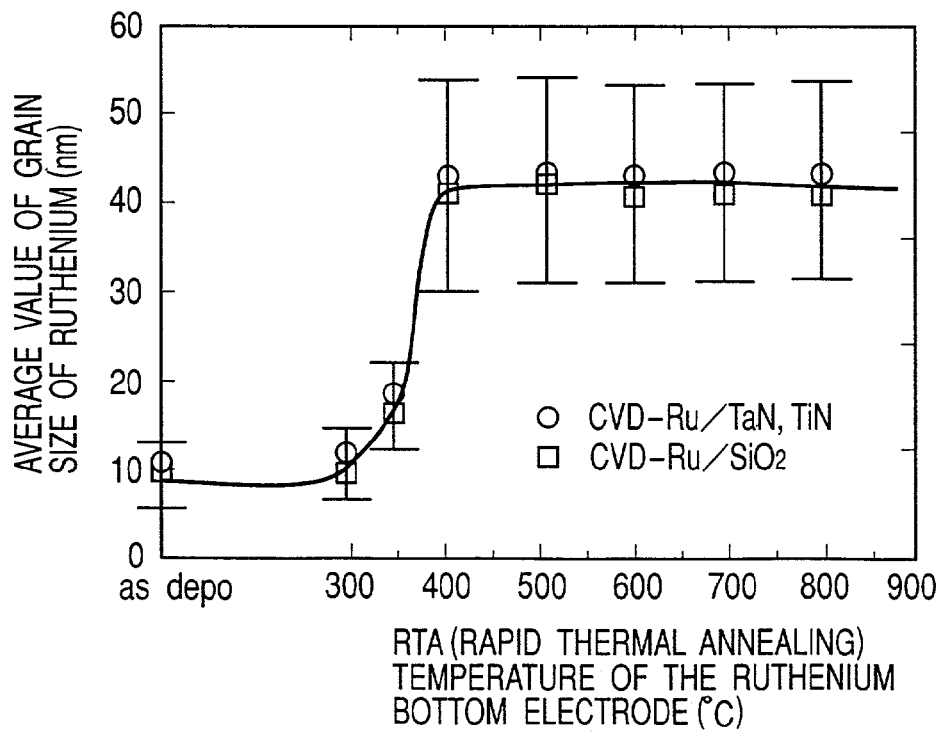
FIG. 10 is a graph showing the relationship between the annealing temperature in an inert atmosphere and the respective crystal grain size.

In this embodiment, there is disclosed a method for annealing the bottom electrode of ruthenium formed by using either method disclosed in Embodiments 1 and 2. For example, a bottom electrode of ruthenium is formed with a thickness of 30 nm by using a diluted precursor of $Ru(C_5H_4C_2H_5)_2$ dissolved in THF with the method shown in Embodiment 1. At this step, the ruthenium electrode is made up of crystal grains each in the form a cylinder with a diameter of about 10 nm and a size of about 30 nm parallel with the film's thickness. The surface condition is coarse due to a difference in film thickness (height) between respective crystal grains. Then, high speed annealing is performed at 500° C. for 2 minutes in a nitrogen atmosphere, the gas atmosphere has to be adjusted so that oxygen is incorporated in the ruthenium film. By this annealing, the ruthenium film is changed into the ruthenium film having a density of 10.5 $g/cm^3$ as shown in FIG. 9 which contains crystal grains with an average grain size of 30 nm to 60 nm as shown in FIG. 10. Simultaneously, the ruthenium film surface becomes flattened. This does not depend upon the underlying layer (barrier film, $SiO_2$). The ruthenium film formed with the foregoing annealing method is not deformed and is stable against the subsequent high-k dielectric film formation and annealing for crystallization. Further, it is also possible to keep the amount of oxygen contamination in the ruthenium film less than the detection limit by a TDS measurement.

Figure 11:
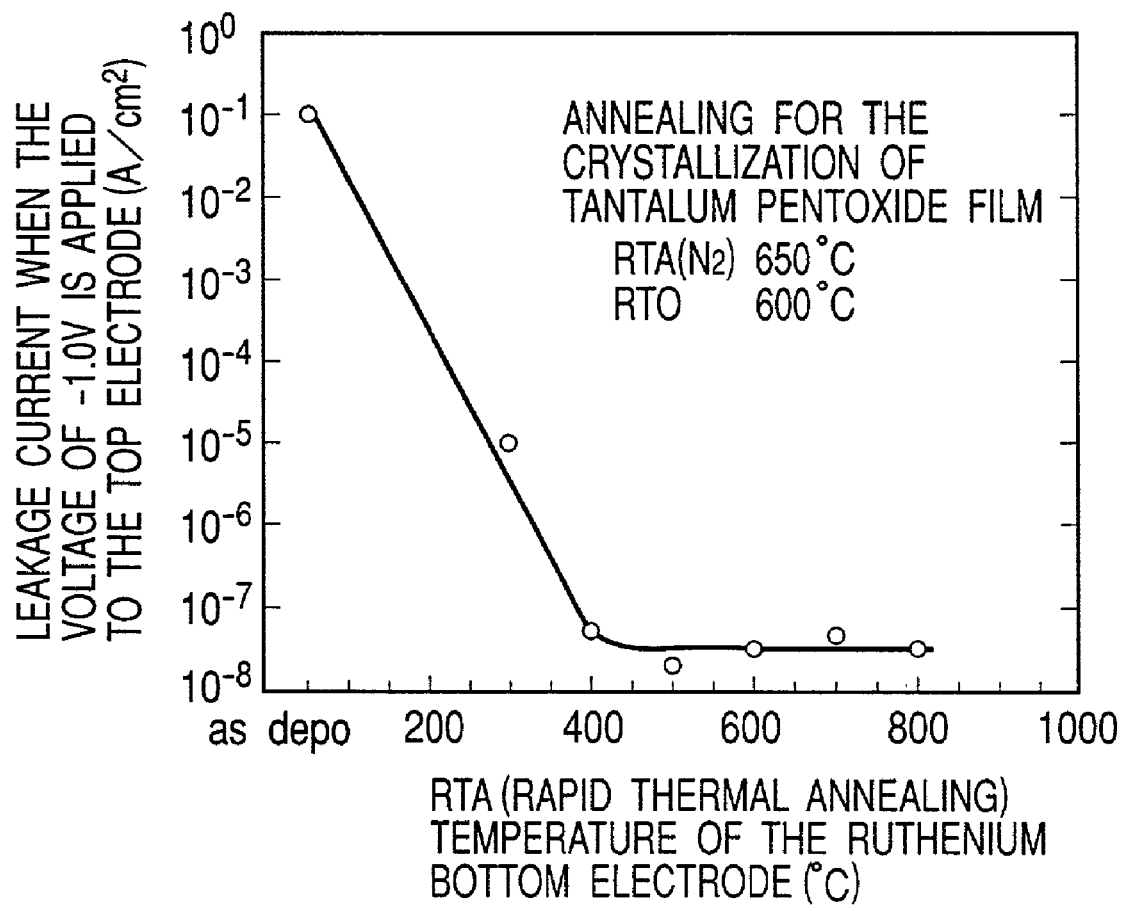
FIG. 11 is a graph showing the relationship between the annealing temperature in an inert atmosphere performed immediately after the formation of a bottom electrode of ruthenium and the withstand voltage of the capacitor.
Figure 12A:
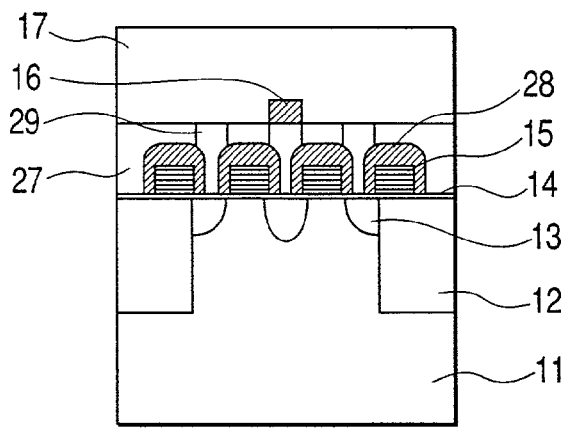
FIGS. 12(a) to 12(c) are diagrams showing the fabricating process of a semiconductor integrated circuit having a capacitor with high-k material for illustrating Embodiment 6 of the present invention.
Figure 12B:
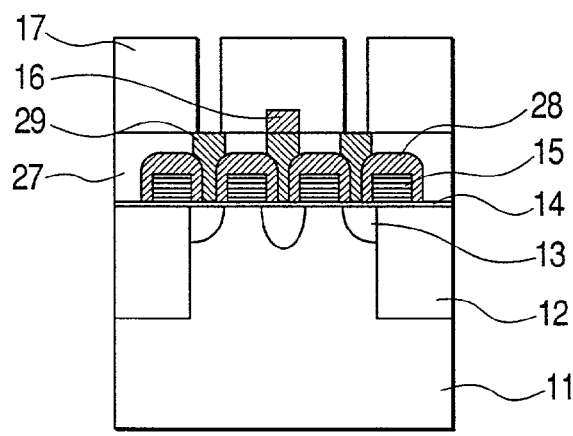
Figure 12C:
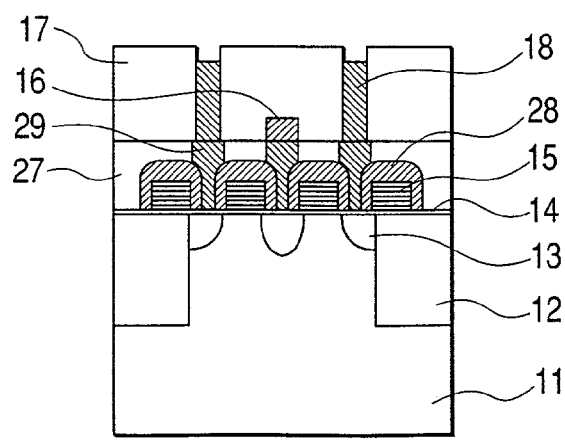
Figure 13A:
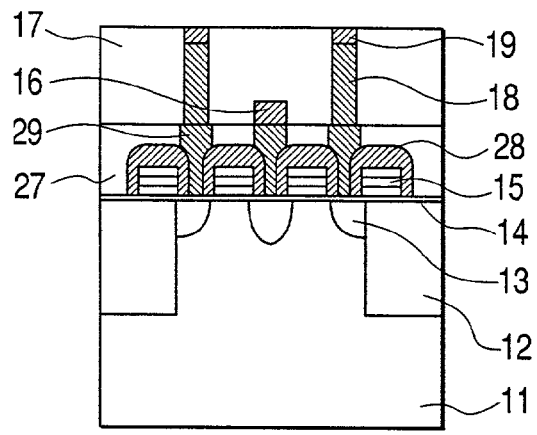
FIGS. 13(a) to 13(c) are diagrams showing the continuing fabricating process of a semiconductor integrated circuit having a capacitor with high-k material for describing Embodiment 6 in FIG. 12.
Figure 13B:
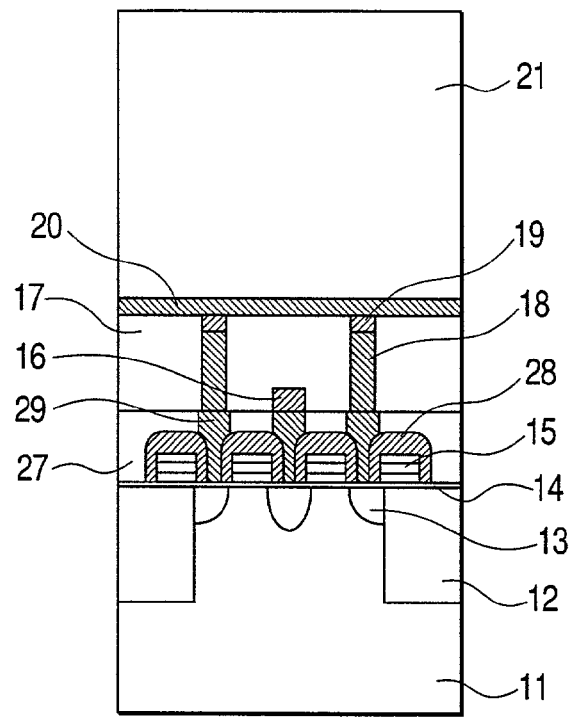
Figure 13C:
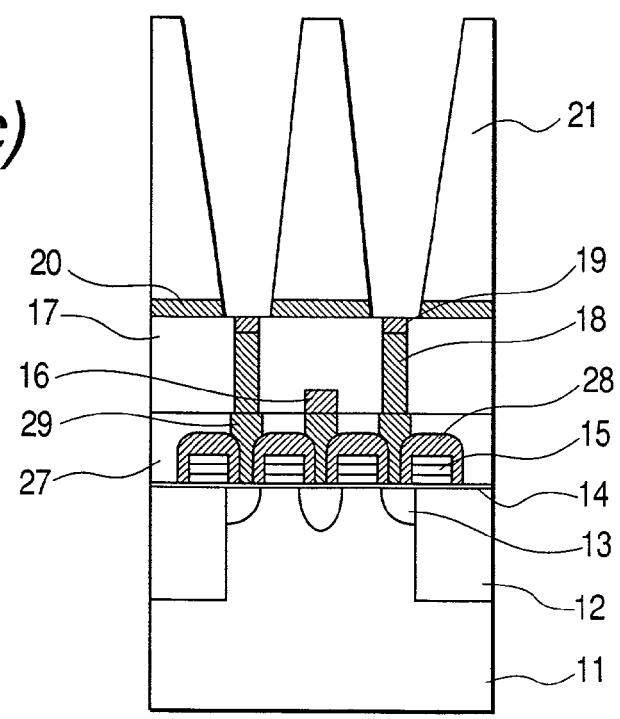
Figure 14A:
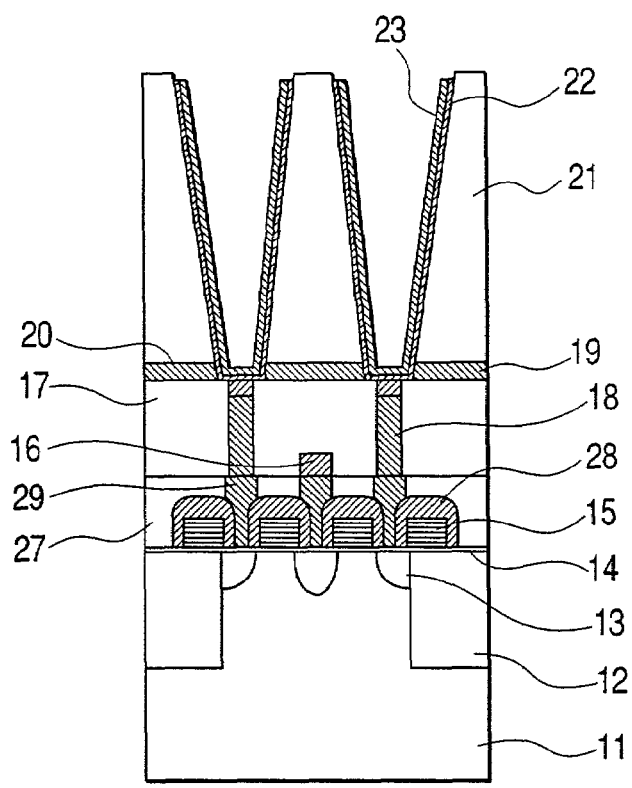
FIGS. 14(a) and 14(b) are diagrams showing the continuing fabricating process of a semiconductor integrated circuit having a capacitor with high-k material for illustrating Embodiment 6 in FIG. 13.
Figure 14B:
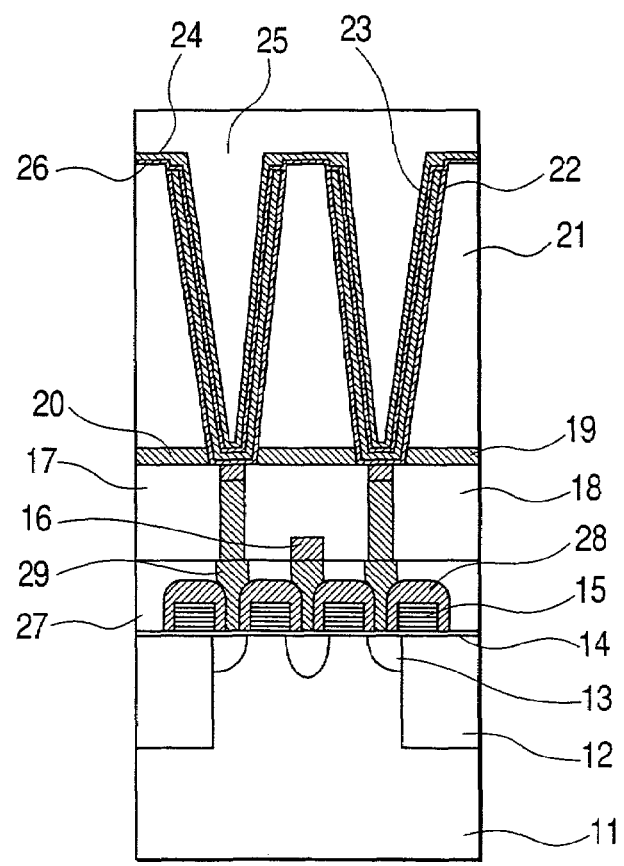
Figure 15:
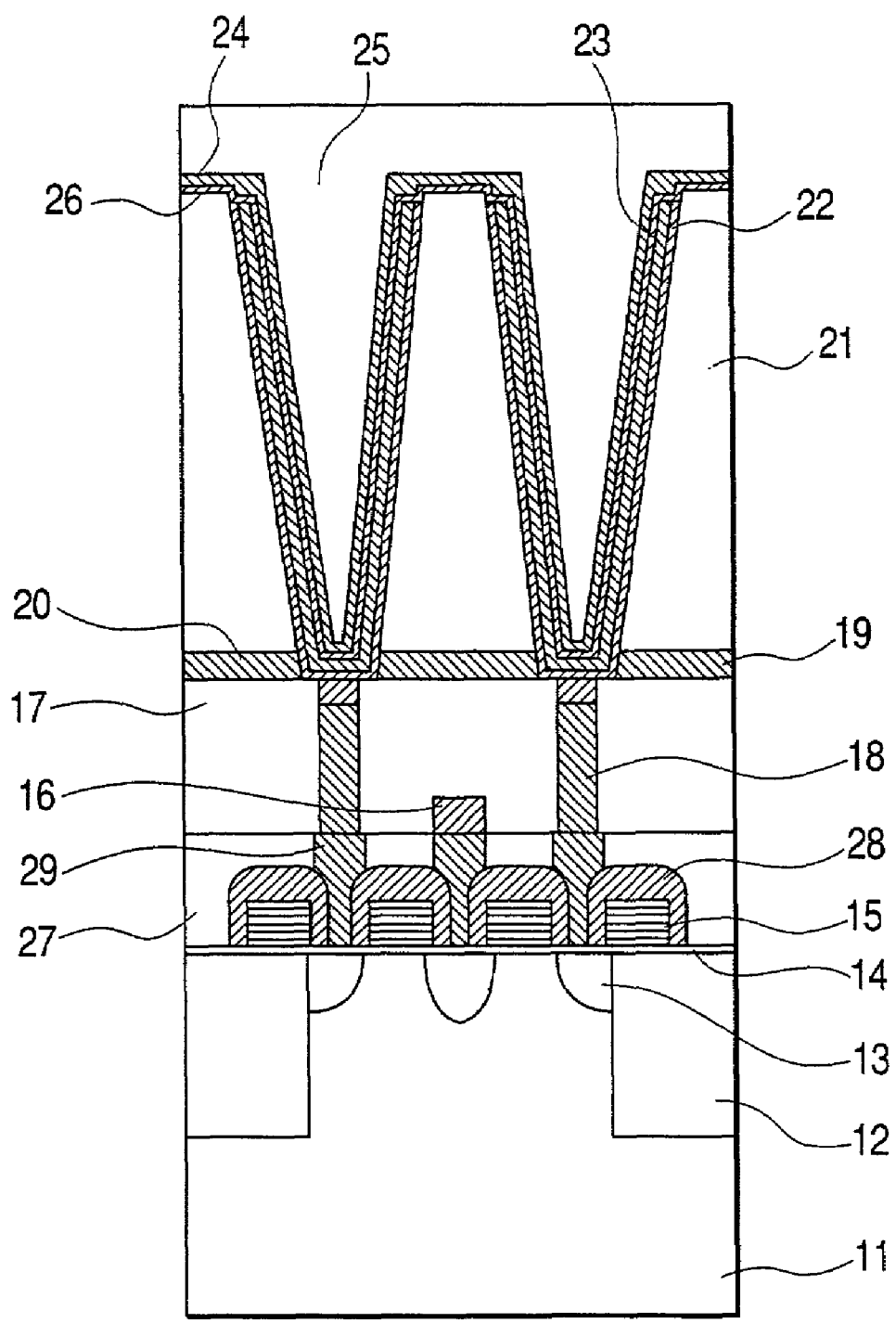
FIG. 15 is an enlarged view of FIG. 14(b)
Figure 16A:
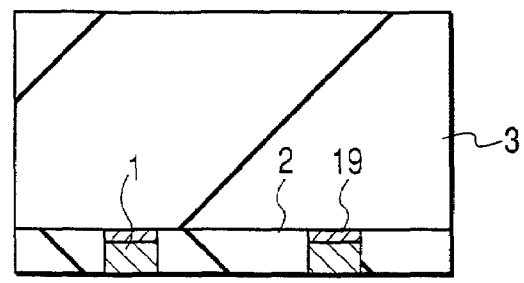
FIGS. 16(a) to 16(e) are vertical sectional views in a step for illustrating the prior art.
Figure 16B:
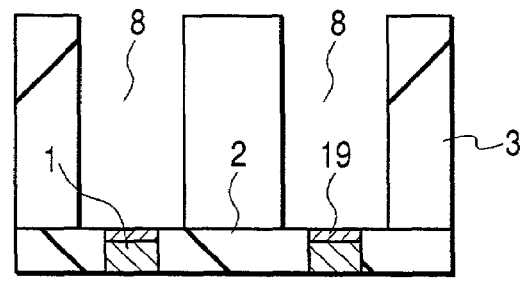
Figure 16C:
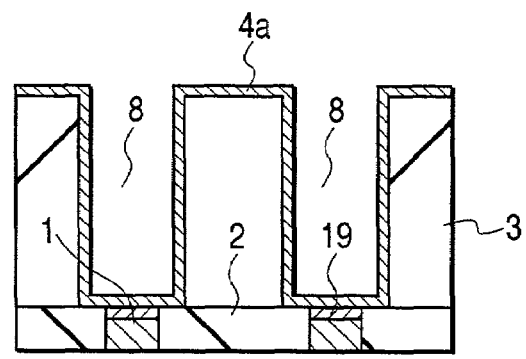
Figure 16D:
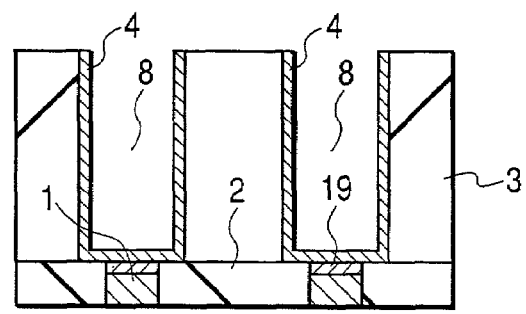
Figure 16E:
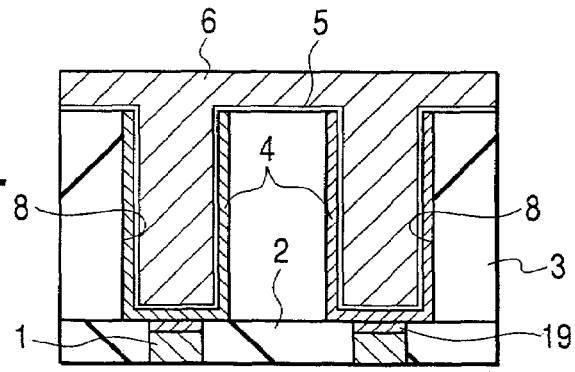

The foregoing annealing of the bottom electrode may be carried out at not less than the growth temperature by a CVD method. It is desirably to be performed at 400° C. or more based upon the results of FIGS. 9, 10, and 11. Further, in order to reduce the thermal load exerted on a semiconductor element, the annealing temperature is desirably lower than the crystallization temperature of the high-k dielectric film. For a tantalum pentoxide film, the crystallization temperature is from 600° C. to 700° C. Therefore, the annealing temperature is desirably 700° C. or less.

The effectiveness of the foregoing annealing method is not limited to the diluted precursor $Ru(C_5H_4C_2H_5)_2$, but also the organoruthenium compounds, such as $Ru(C_5H_4C_2H_5)_2$, $Ru(OD)_3$, $Ru(CH_3C_5H_4)_2$, $Ru(C_5H_5)_2$, and $Ru(C_{11}H_{19}O_2)_3$ in a solid state at room temperature (supplied without a solvent as shown in Embodiment 2). And the diluted precursors dissolved in the solvents may be methanol, ethanol, 1-propanol, 2-propanol, isobutyl alcohol, 1-butanol, 2-butanol, diethyl ether, diisopropyl ether, octane, tetrahydropyran, 1,4-dioxane, acetone, methyl ethyl ketone, and toluene, other than a THF solvent. It is also possible to form a flat ruthenium film with high thermal stability by performing the same annealing as the described above.

However, for a compound including oxygen in its molecule such as $Ru(OD)_3$ or $Ru(C_{11}H_{19}O_2)_3$, even if a ruthenium film is formed by the method shown in Embodiment 1 or 2, a slight amount of oxygen is detected by a TDS measurement. As for such a film, it is possible to remove the oxygen in the film by performing annealing thereof in an atmosphere of nitrogen gas at 450° C. for 2 minutes. Further, it is possible to reduce the amount of oxygen contamination to less than the detection limit by a TDS measurement by performing annealing thereof at 400° C. for 2 minutes in an atmosphere containing 3% hydrogen in a nitrogen gas. The annealing in a reducing atmosphere containing hydrogen or the like can remove the oxygen left in a slight amount in the film.

Embodiment 6

In this embodiment, a method for fabricating a memory device (memory cell) includes forming a bottom electrode of ruthenium by the CVD method described in Embodiment 1, and forming a top electrode of ruthenium described in Embodiment 3 by reference to FIGS. 12 to 15.

First, a memory cell selective transistor is formed on a semiconductor substrate 11 made of, for example, a p single crystal silicon by using a known method. The memory cell selective transistor is formed of an isolation 12, a diffusion layer 13, a gate oxide film 14, a word line 15 made up of a lamination of (1) a barrier metal film made of Poly-Si, (2) a film of WN or TiN, and (3) a W film, a plug 29 made of poly-Si or the like, etc. A bit line 16 made of a lamination of TiN and W is formed on the transistor. Subsequently, a silicon dioxide film 17 is deposited on top of the bit line by a CVD method, and the surface thereof is flattened by a chemical mechanical polishing method (FIG. 12($a$)). Further, a contact hole for a plug, which ensures the electrical connection between the selective transistor and a capacitor, is formed by a dry etching method (FIG. 12($b$)). Then, an n polysilicon film is buried in the contact hole by a CVD process, and then the n polysilicon film outside the contact hole is removed by an etch-back method to form a polysilicon plug 18 (FIG. 12($c$)). Subsequently, a barrier film 19 made of TiN, TiAlN, TaN, or the like is formed by a sputtering method, and the whole film 19 is removed by chemical polishing, the portion of the barrier film 19 is left on the polysilicon plug 19 in the contact hole (FIG. 13($a$)). A silicon nitride film 20 of about 100 nm thick is deposited thereon by a CVD method to serve as an etching stopper for processing the silicon dioxide film. On the silicon nitride film, a silicon dioxide film (interlayer insulator of capacitor region) 21 using tetraethoxysilane (TEOD) as a precursor is formed of 2 μm thick (FIG. 13($b$)). The silicon dioxide film 21 and the silicon nitride film 20 are processed by a dry etching method using a photoresist as a mask to form a groove for a bottom electrode on top of the plug made up of the polysilicon plug 18 and the barrier layer 19 (FIG. 13($c$)). Subsequently, a ruthenium film is deposited with a thickness of 20 nm by a sputtering method. At this step, a ruthenium seed layer 22 with a film of 1 nm to 2 nm thick is formed on the side portion of the groove. Further, with the CVD process using the diluted precursor of $Ru(C_5H_4C_2H_5)_2$/THF of FIG. 1 described in Embodiment 1, a bottom electrode of ruthenium is formed with a film of 30 nm thick and a good step coverage. Then, by a known etch-back technology using a photoresist film, the ruthenium film is isolated on a bit basis, and then subjected to annealing at 500° C. for 2 minutes in a nitrogen gas as described in Embodiment 5 to complete a bottom electrode of ruthenium 23 (FIG. 14 ($a$)). Then, a high-k dielectric film (tantalum pentoxide film) 26 is formed of about 10 nm thick by a chemical vapor deposition method. The tantalum pentoxide film is deposited by using $Ta(OC_2H_5)$ and $O_2$ as precursor gases at a temperature range of 400° C. to 450° C. Then, the film is subjected to annealing at 650° C. for 2 minutes in an inert atmosphere for crystallization of the tantalum pentoxide film, and then annealing at 550° C. for 2 minutes in an oxidation atmosphere. Subsequently, a top electrode is formed. First, a ruthenium film is deposited with a film of 20 nm thick on the tantalum pentoxide film by a sputtering method. At this step, a top ruthenium seed layer 24 of about 1nm thick can be formed on the side of the tantalum pentoxide film in the groove. Further, with the CVD process using the diluted precursor of $Ru(C_5H_4C_2H_5)_2$/THF of FIG. 3($b$) described in Embodiment 3, a top electrode of ruthenium 25 is formed with a film of 70 nm thick. Further, annealing is performed at not less than the growth temperature, desirably from 300° C. to 500° C. in an oxidation atmosphere to roughly complete a memory cell unit of a DRAM (FIGS. 14($b$) and 15). Subsequently, an interlayer insulator of wiring region made of a silicon dioxide film or the like is formed on top of the memory cell. Further, about two layers of Al wiring is formed, and a passivation film is formed to complete the DRAM.

As described in detail above, according to this embodiment, it is possible to inhibit the oxidation of the barrier layer, and to form a memory cell with a small leakage current of a capacitor. The memory operation of the memory device is checked. And it has been confirmed that a desired characteristics are obtained.

The CVD processes and the annealing method for the bottom electrode of ruthenium and the top electrode of ruthenium described above are a combination of the methods described in Embodiments 1, 2, 3, 4, and 5, and a DRAM has the same characteristics as described above can be so formed. Further, the capacitor insulator may be (Ba, Sr) $TiO_3$[BST] or $SrTiO_3$ formed by a CVD method other than the tantalum pentoxide film. For BST, it is formed by a CVD method using $[Ba(DPM)_2[Ba\{(CH_3)_3CCOCH_2COC(CH_3)_3\}_3$: barium dipivaloylmethanate], $Sr(DPM)_2[Sr\{(CH_3)_3CCOCH_2COC(CH_3)_3\}_3$: strontium dipivaloylmethanate], or $Ti(OC_3H_7)_4$(triisopropoxidetitanium), as a precursor at 400° C. In this case, the crystallization temperature is 550° C. to 700° C.

Although the invention achieved by the present inventors is described above based on specific embodiments thereof, it is to be understood that the invention is not limited to the specific embodiments thereof, and it is believed obvious that various changes and modifications may be made in the invention without departing from the spirit and scope thereof.

Out of the aspects of the invention disclosed by this application, the effect obtained by the typical one thereof is described briefly, below.

It is possible to form a ruthenium electrode with a small amount of oxygen contamination and high thermal stability by a chemical vapor deposition method. Therefore, it is possible to implement high integration due to downsizing of a semiconductor memory device. As results, an improved yield, a lower cost due to a reduction in number of steps, and the like are achieved.

The present invention may be embodied in other specific forms without departing from the spirit or essential characteristics thereof The described embodiments are to be considered in all respects only as illustrated and not restrictive. Variations and changes may be made by one skilled in the art without departing from the spirit of the present invention. Accordingly, it is expressly intended that all such variations or changes which fall within the spirit and scope of the present invention as defined in the claims, be embraced thereby.

What is claimed is:

1. A fabricating method of a semiconductor integrated circuit device having a capacitor with high-k material, comprising steps of:
   (a) forming a bottom electrode of said capacitor over a semiconductor substrate by a chemical vapor deposition method in a sub-atmospheric pressure using an organoruthenium compound as a precursor;

(b) forming a dielectric film of said capacitor on said bottom electrode; and (c) forming a top electrode of said capacitor on said dielectric film, wherein the step (a) includes sub-steps of:

(a-1) providing the semiconductor substrate in a deposition chamber;

(a-2) after the step (a-1), increasing a temperature of the semiconductor substrate in the chamber up to a desired temperature without supplying any oxidation gas to the deposition chamber;

(a-3) after the step (a-2), separately supplying the precursor and an oxidation gas into the deposition chamber to form a ruthenium film for the bottom electrode with a desired thickness on the heated semiconductor substrate, said oxidation gas being separately supplied to said deposition chamber by a supplying system different from a precursor supplying system and only during when the precursor being supplied;

(a-4) after the step (a-3), stopping the supply of the precursor and said oxidation gas; and (a-5) after the step (a-4), decreasing the temperature of the semiconductor substrate without supplying the oxidation gas to the deposition chamber, wherein said bottom electrode essentially consists of ruthenium.

2. The fabricating method of a semiconductor integrated circuit device according to claim 1, wherein the ruthenium electrode forming method further includes a step of introducing a balance gas in addition to a carrier gas so as to keep a pressure in the deposition chamber constant through all of the other steps.

3. The fabricating method of a semiconductor integrated circuit device according to claim 1, during the supplying step, the oxidation gas and an inert gas are supplied such that a oxygen partial pressure created by the oxidation gas in the deposition chamber is 0.1 Torr or less such that an amount of oxygen adsorption onto a surface of the semiconductor substrate is set to a minimum amount required for decomposing the precursor.

4. The fabricating method of a semiconductor integrated circuit device according to claim 1, during the supplying step, the oxidation gas, an inert gas, and a solvent gas are supplied such that the oxygen partial pressure in the deposition chamber is 0.5 Torr or less such that the amount of oxygen adsorption onto the surface of the semiconductor substrate is set to a minimum amount required for decomposing the precursor.

5. The fabricating method of a semiconductor integrated circuit device according to claim 1, during the supplying step, the precursor of an organoruthenium compound is dissolved in a solvent as the precursor, and wherein the ruthenium electrode forming method further includes a step of supplying the oxidation gas and an inert gas such that the oxygen partial pressure in the deposition chamber is 0.1 Torr or less thereby setting the amount of oxygen adsorption onto the surface of the semiconductor substrate to a minimum amount required for the decomposition of the precursor thereby increasing the amount of oxygen adsorption onto the surface of the semiconductor substrate and shortening a growth time of the electrode.

6. The fabricating method of a semiconductor integrated circuit device according to claim 1, during the supplying step, a diluted precursor of an organoruthenium compound is dissolved in a solvent as the precursor, and wherein the ruthenium electrode forming method further includes a step of supplying the oxidation gas, an inert gas, and a solvent gas such that the oxygen partial pressure in the deposition chamber is 0.5 Torr or less thereby setting the amount of oxygen adsorption onto the surface of the semiconductor substrate to a minimum amount required for the decomposition of the precursor thereby increasing the amount of oxygen adsorption onto the surface of the semiconductor substrate and shortening a growth time of the electrode.

7. The fabricating method of a semiconductor integrated circuit device according to claim 1, the supplying step further comprising a step of controlling the amount of oxygen adsorption onto the surface of the semiconductor substrate by the amount of a supplied vaporized solvent gas.

8. The fabricating method of a semiconductor integrated circuit device according to claim 1, wherein the organoruthenium compound comprises at least one of bis-(cyclopentadienyl)ruthenium $[Ru(C_5H_5)_2]$,
bis-(methylcyclopentadienyl)ruthenium $[Ru(CH_3C_5H_4)_2]$,
bis-(ethylcyclopentadienyl)ruthenium $[Ru(C_2H_5C_5H_4)_2]$,
tris-(dipivaloylmethanate)ruthenium $[Ru(C_{11}H_{19}O_2)_3]$, and $Ru(OD)_3$.

9. The fabricating method of a semiconductor integrated circuit device according to claim 1, wherein the solvent for dissolving the organoruthenium compound to comprises at least one of methanol, ethanol, 1-propanol, 2-propanol, isobutyl alcohol, 1-butanol, 2-butanol, diethyl ether, diisopropyl ether, octane, tetrahydropuran, tetrahydropyran, 1,4-dioxane, acetone, methyl ethyl ketone, and toluene.

10. A fabricating method of a semiconductor integrated circuit device according to claim 1, further comprising:

after forming the bottom electrode, immediately performing annealing at not less than a formation temperature of the bottom electrode made of ruthenium in a reducing atmosphere containing hydrogen thereby removing oxygen introduced into a surface of said ruthenium metal film when said ruthenium metal film is formed therefrom and inhibiting deformation of crystal grains of the bottom electrode of ruthenium in the annealing step during or after forming a high-k capacitor insulator.

11. The fabricating method of a semiconductor integrated circuit device according to claim 10, wherein the annealing temperature in the reducing atmosphere is not more than the annealing temperature for crystallization of the capacitor insulator.

12. The fabricating method of a semiconductor integrated circuit device according to claim 10, wherein the temperature at which the deformation of crystal grains of the bottom electrode of ruthenium is inhibited is 800° C. or less.

13. The fabricating method of a semiconductor integrated circuit device according to claim 10, wherein a grain size of the crystal grains of the bottom electrode of ruthenium ranges from 30 nm to 60 nm.

14. The fabricating method of a semiconductor integrated circuit device according to claim 1, wherein the bottom electrode of ruthenium of a capacitor with high-k material is formed on the semiconductor substrate, and immediately thereafter annealing is performed at not less than the formation temperature of the bottom electrode of ruthenium in an inert atmosphere or a reducing atmosphere thereby inhibiting deformation of crystal grains of the bottom electrode of ruthenium in the annealing step during or after capacitor insulator formation.

15. The fabricating method of a semiconductor integrated circuit device according to claim 1, wherein the oxidation gas comprises at least one of $O_2$, $N_2O$, $H_2O$, $NO_2$, and $O_3$.

16. The fabricating method of a semiconductor integrated circuit device according to claim 4, wherein the inert gas comprises at least one of $N_2$, He, Ar, Ne, and Xe.

17. The fabricating method of a semiconductor integrated circuit device according to claim 10, whereby the annealing step is performed at a temperature lower than a crystallization temperature of the high-k capacitor.

18. A fabricating method of a semiconductor integrated circuit device having a capacitor with high-k material, comprising steps of:
  (a) forming a bottom electrode of said capacitor over a semiconductor substrate;
  (b) forming a dielectric film of said capacitor on said bottom electrode: and
  (c) forming a top electrode of said capacitor on said dielectric film by a chemical vapor deposition method in a sub-atmospheric pressure using an organoruthenium compound as a precursor,
  wherein the step (c) includes sub-steps of:
  (c-1) providing the semiconductor substrate in a deposition chamber;
  (c-2) after the step (c-1), increasing a temperature of the semiconductor substrate in the chamber up to a desired temperature with supplying an oxidation gas to the deposition chamber;
  (c-3) after the step (c-2), separately supplying the precursor and said oxidation gas into the deposition chamber to form a ruthenium film for the top electrode with a desired thickness on the heated semiconductor substrate, said oxidation gas being separately supplied to said deposition chamber by a supplying system different from a precursor supplying system;
  (c-4) after the step (c-3), stopping the supply of the precursor and said oxidation gas; and
  (c-5) after the step (c-4), decreasing the temperature of the semiconductor substrate with supplying an oxidation gas to the deposition chamber,
  wherein said top electrode essentially consists of ruthenium, and
  said oxidation gas is supplied to said deposition chamber when the substrate temperature is increased, when the precursor is supplied, and when the substrate temperature is decreased.

19. The fabricating method of a semiconductor integrated circuit device according to claim 18, wherein the ruthenium electrode forming method further includes a step of introducing a balance gas in addition to a carrier gas so as to keep a pressure in the deposition chamber constant through all of the other steps.

20. The fabricating method of a semiconductor integrated circuit device according to claim 18, during the supplying step, the oxidation gas and an inert gas are supplied such that a oxygen partial pressure created by the oxidation gas in the deposition chamber is 0.1 Torr or less such that an amount of oxygen adsorption onto a surface of the semiconductor substrate is set to a minimum amount required for decomposing the precursor.

21. The fabricating method of a semiconductor integrated circuit device according to claim 18, during the supplying step, the oxidation gas, an inert gas, and a solvent gas are supplied such that the oxygen partial pressure in the deposition chamber is 0.5 Torr or less such that the amount of oxygen adsorption onto the surface of the semiconductor substrate is set to a minimum amount required for decomposing the precursor.

22. The fabricating method of a semiconductor integrated circuit device according to claim 21, during the supplying step, the precursor of an organoruthenium compound is dissolved in a solvent as the precursor, and
  wherein the top electrode forming method further includes a step of supplying the oxidation gas and an inert gas such that the oxygen partial pressure in the deposition chamber is 0.1 Torr or less thereby setting the amount of oxygen adsorption onto the surface of the semiconductor substrate to a minimum amount required for the decomposition of the precursor thereby increasing the amount of oxygen adsorption onto the surface of the semiconductor substrate and shortening a growth time of the electrode.

23. The fabricating method of a semiconductor integrated circuit device according to claim 18, during the supplying step, a diluted precursor of an organoruthenium compound is dissolved in a solvent as the precursor, and wherein the top electrode forming method further includes a step of supplying the oxidation gas, an inert gas, and a solvent gas such that the oxygen partial pressure in the deposition chamber is 0.5 Torr or less thereby setting the amount of oxygen adsorption onto the surface of the semiconductor substrate to a minimum amount required for the decomposition of the precursor thereby increasing the amount of oxygen adsorption onto the surface of the semiconductor substrate and shortening a growth time of the electrode.

24. The fabricating method of a semiconductor integrated circuit device according to claim 18, during increasing the substrate temperature, oxygen partial pressure in the deposition chamber is 0.5 Torr or less.

25. The fabricating method of a semiconductor integrated circuit device according to claim 18, the supplying step further comprising a step of controlling the amount of oxygen adsorption onto the surface of the semiconductor substrate by the amount of a supplied vaporized solvent gas.

26. The fabricating method of a semiconductor integrated circuit device according to claim 18, wherein the organoruthenium compound comprises at least one of
  bis-(cyclopentadienyl)ruthenium [$Ru(C_5H_5)_2$],
  bis-(methylcyclopentadienyl)ruthenium [$Ru(CH_3C_5H_4)_2$],
  bis-(ethylcyclopentadienyl)ruthenium [$Ru(C_2H_5C_5H_4)_2$],
  tris-(dipivaloylmethanate)ruthenium [$Ru(C_{11}H_{19}O_2)_3$], and $Ru(OD)_3$.

27. The fabricating method of a semiconductor integrated circuit device according to claim 18, wherein the solvent for dissolving the organoruthenium compound to comprises at least one of methanol, ethanol, 1-propanol, 2-propanol, isobutyl alcohol, 1-butanol, 2-butanol, diethyl ether, diisopropyl ether, octane, tetrahydropuran, tetrahydropyran, 1,4-dioxane, acetone, methyl ethyl ketone, and toluene.

28. The fabricating method of a semiconductor integrated circuit device according to claim 18, wherein the oxidation gas comprises at least one of $O_2$, $N_2O$, $H_2O$, $NO_2$, and $O_3$.

29. The fabricating method of a semiconductor integrated circuit device according to claim 20, wherein the inert gas comprises at least one of $N_2$, He, Ar, Ne, and Xe.

* * * * *